(12) United States Patent
Rueger et al.

(10) Patent No.: US 8,274,221 B2
(45) Date of Patent: Sep. 25, 2012

(54) PLASMA-GENERATING STRUCTURES, DISPLAY DEVICES, AND METHODS OF FORMING PLASMA-GENERATING STRUCTURES

(75) Inventors: Neal R. Rueger, Boise, ID (US); Stephen J. Kramer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/231,806

(22) Filed: Sep. 13, 2011

(65) Prior Publication Data
US 2012/0001539 A1 Jan. 5, 2012

Related U.S. Application Data

(62) Division of application No. 12/633,674, filed on Dec. 8, 2009, now Pat. No. 8,033,884, which is a division of application No. 11/777,762, filed on Jul. 13, 2007, now Pat. No. 7,649,316.

(51) Int. Cl.
*H01J 17/49* (2012.01)
*H01J 9/00* (2006.01)

(52) U.S. Cl. .......................................... 313/582; 445/23
(58) Field of Classification Search .......... 313/582–587; 445/49–51, 23–25; 438/20, 619
See application file for complete search history.

(56) References Cited

U.S. PATENT DOCUMENTS

| | | | |
|---|---|---|---|
| 5,627,435 A | 5/1997 | Jansen et al. | |
| 6,528,947 B1 | 3/2003 | Chen et al. | |
| 7,160,788 B2 | 1/2007 | Sandhu et al. | |
| 2004/0018320 A1 | 1/2004 | Nicolussi | |
| 2005/0003098 A1 | 1/2005 | Kohler et al. | |
| 2005/0051517 A1 | 3/2005 | Oehrlein et al. | |
| 2006/0263968 A1 | 11/2006 | Manning | |
| 2007/0032014 A1 | 2/2007 | Sandhu et al. | |

FOREIGN PATENT DOCUMENTS

JP 2001226775 8/2001

OTHER PUBLICATIONS

Castano et al., "Anistropy and magnetotransport in ordered magnetic antidot arrays", Applied Physics Letters, 85(14), pp. 2872-2874, Oct. 4, 2004.

Hopwood et al., "Fabrication and characterization of a micromachined 5 mm inductively coupled plasma generator", J. Va. Sci. Technol. B 18(5), Sep./Oct. 2000, pp. 2445-2451, 2000, American Vacuum Society.

(Continued)

*Primary Examiner* — Joseph L Williams
(74) *Attorney, Agent, or Firm* — Wells St. John P.S.

(57) ABSTRACT

Some embodiments include methods of forming plasma-generating microstructures. Aluminum may be anodized to form an aluminum oxide body having a plurality of openings extending therethrough. Conductive liners may be formed within the openings, and circuitry may be formed to control current flow through the conductive liners. The conductive liners form a plurality of hollow cathodes, and the current flow is configured to generate and maintain plasmas within the hollow cathodes. The plasmas within various hollow cathodes, or sets of hollow cathodes, may be independently controlled. Such independently controlled plasmas may be utilized to create a pattern in a display, or on a substrate. In some embodiments, the plasmas may be utilized for plasma-assisted etching and/or plasma-assisted deposition. Some embodiments include constructions and assemblies containing multiple plasma-generating structures.

30 Claims, 19 Drawing Sheets

OTHER PUBLICATIONS

Inoue et al., "New roots to formation of nanostructures on glass surface through anodic oxidation of sputtered aluminum", Science and Technology of Advanced Materials, 2003.

Masuda et al., "Highly ordered nanochannel-array-architecture in anodic alumina", American Institute of Physics, Letters 71(19), Nov. 10, 1997.

Masuda et al., "Square and Triangular Nanohole Array Architechtures in Anodic Alumina", Advanced Materials No. 3, Feb. 5, 2001.

Nielsch et al., "Self-ordering Regimes of Porous Alumina: The 10% Porosity Rule", NANO Letters, 2002 American Chemical Society, 2(7), Jul. 2002.

Ono et al., "Self-Ordering of Anodic Porous Alumina Induced by Local Current Concentration: Burning", Electrochemical and Solid-State Letters, 7(7) B21-B24, Apr. 26, 2004.

Shingubara et al., "Self-Organization of a Porous Alumina Nanohole Array Using a Sulfuric/Oxalic Acid Mixture as Electrolyte", Electrochemical and Solid-State Letter, 7(3) E15-E17, Jan. 13, 2004.

Shingubara, "Fabrication of nanomaterials using porous alumina templates", Journal of Nanoparticle Research 5:17-30, Mar. 29, 2003.

Vrublevsky et al., "Analysis of porous oxide film growth on aluminum in phosphoric acid using re-anodizing technique", Article in Press Aug. 30, 2004. www.sciencedirect.com.

Xu et al., "Bone-Shaped Nanomaterials for Nanocomposite Applications", Nano Letters, 3(8), pp. 1135-1139, Jun. 19, 2003.

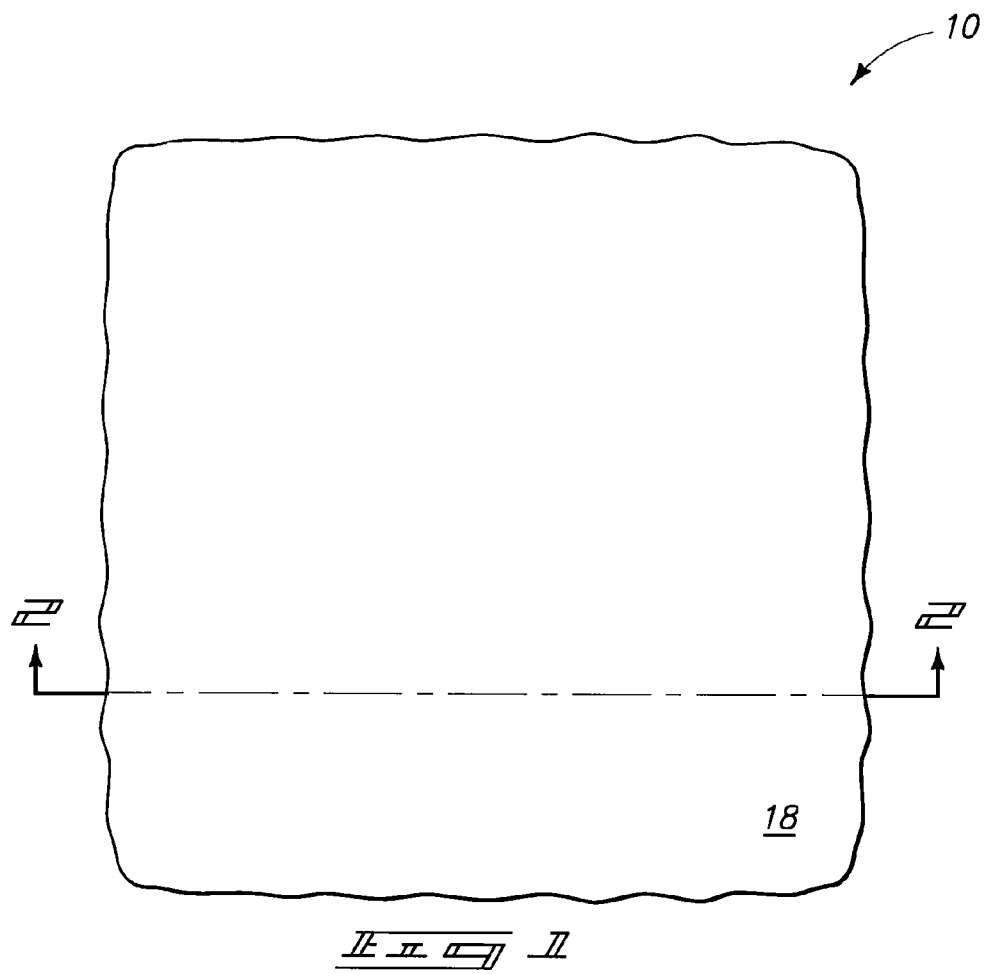
_Fig. 1_
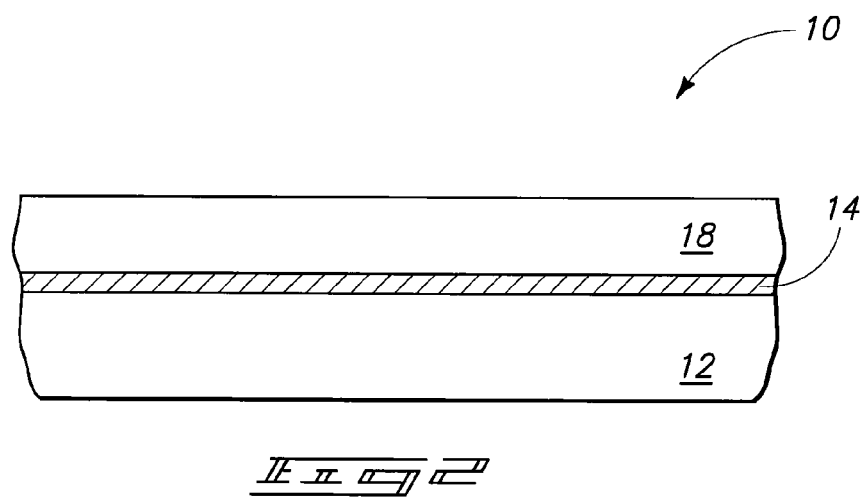
_Fig. 2_

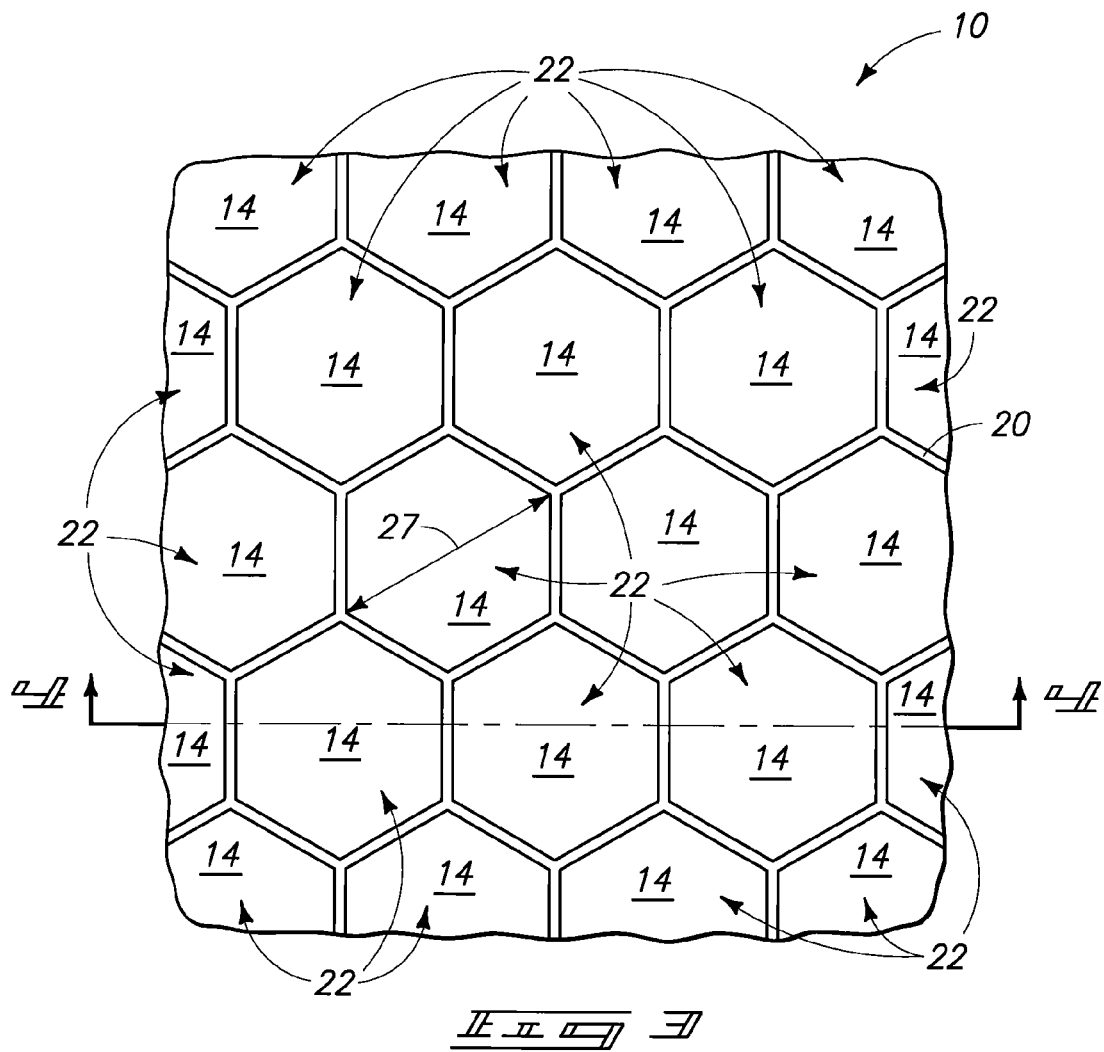
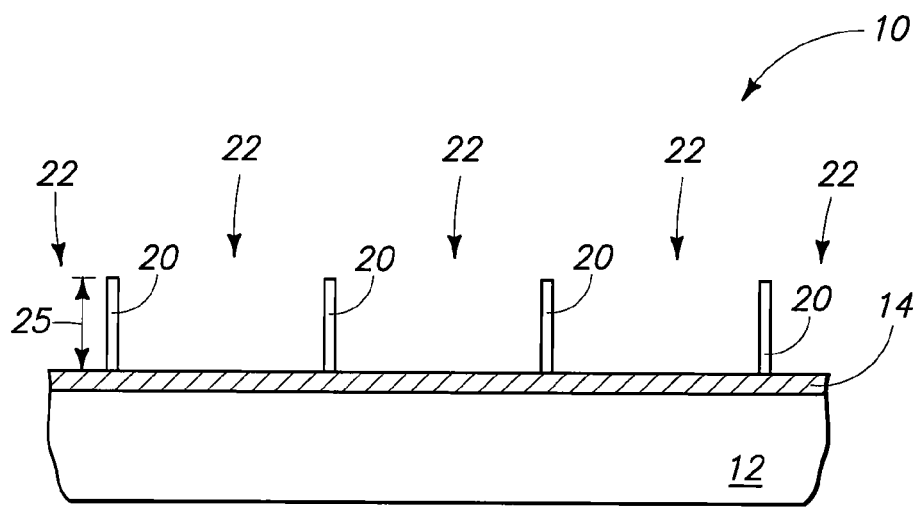

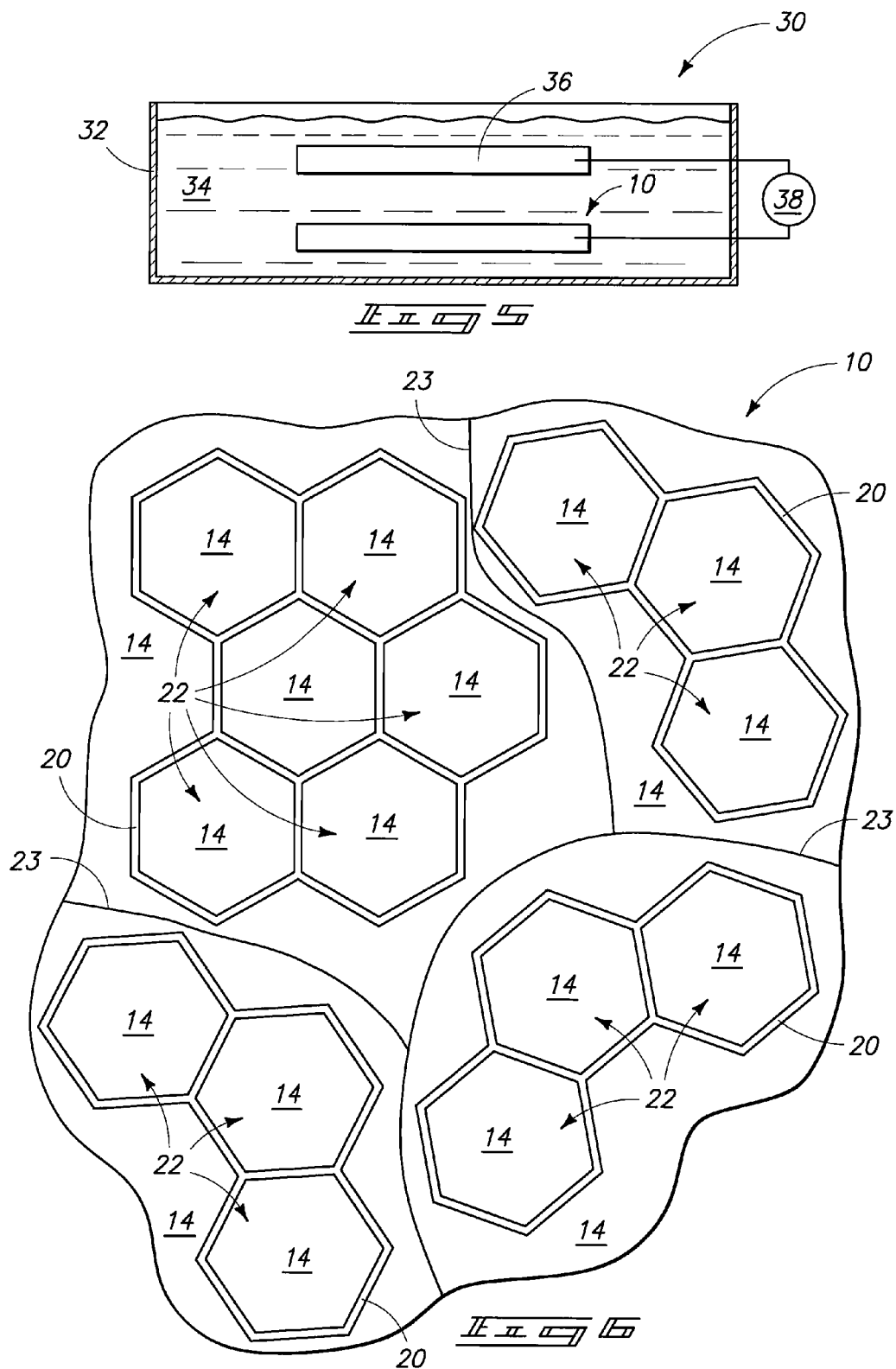

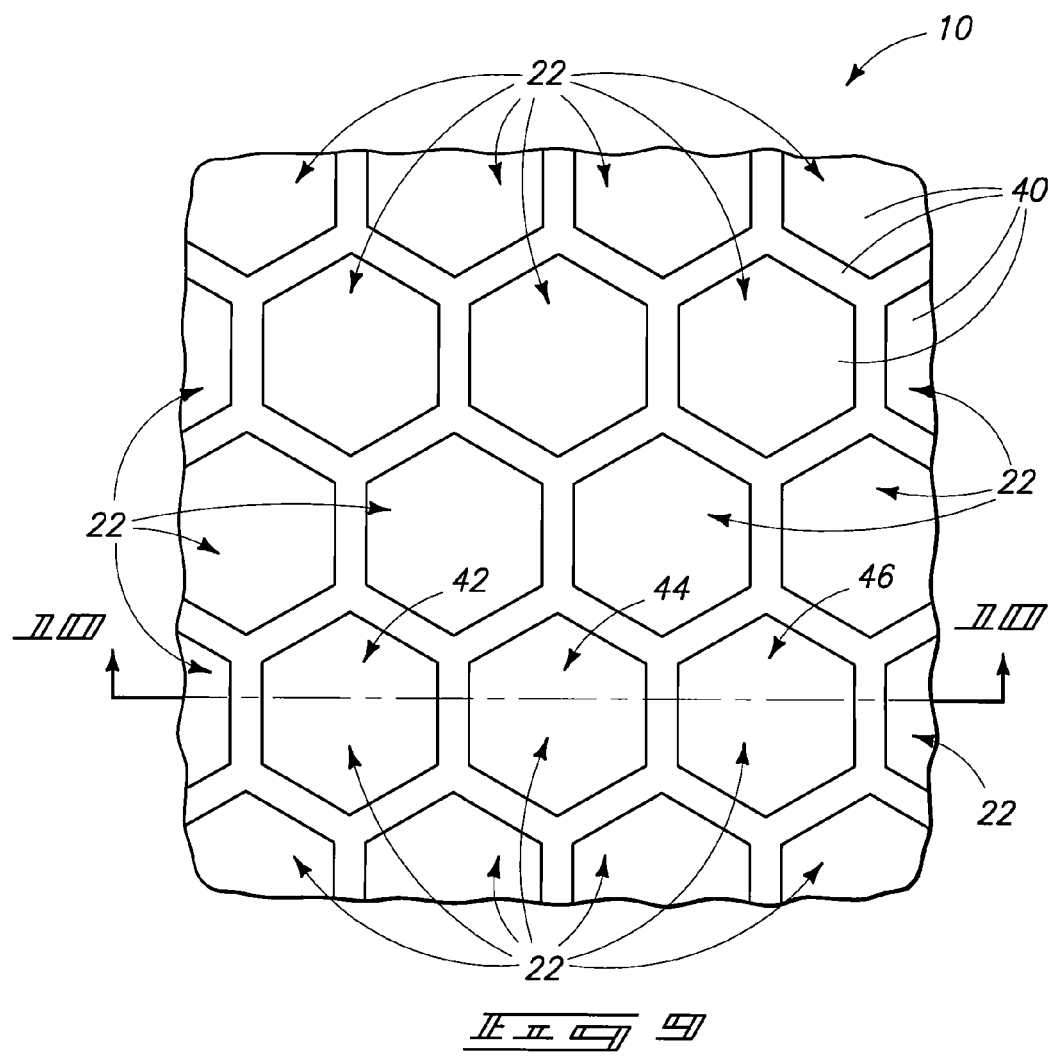
_FIG_ 9
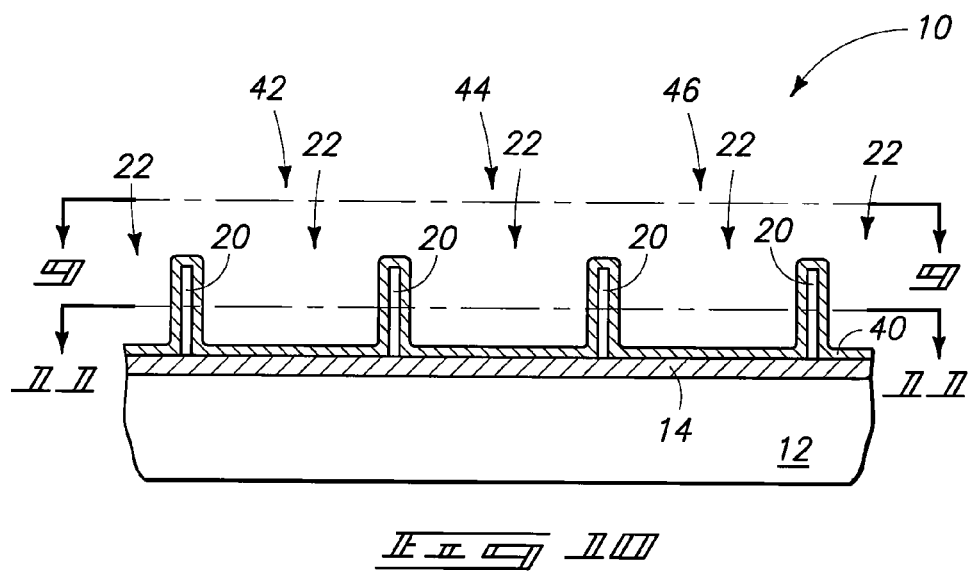
_FIG_ 10

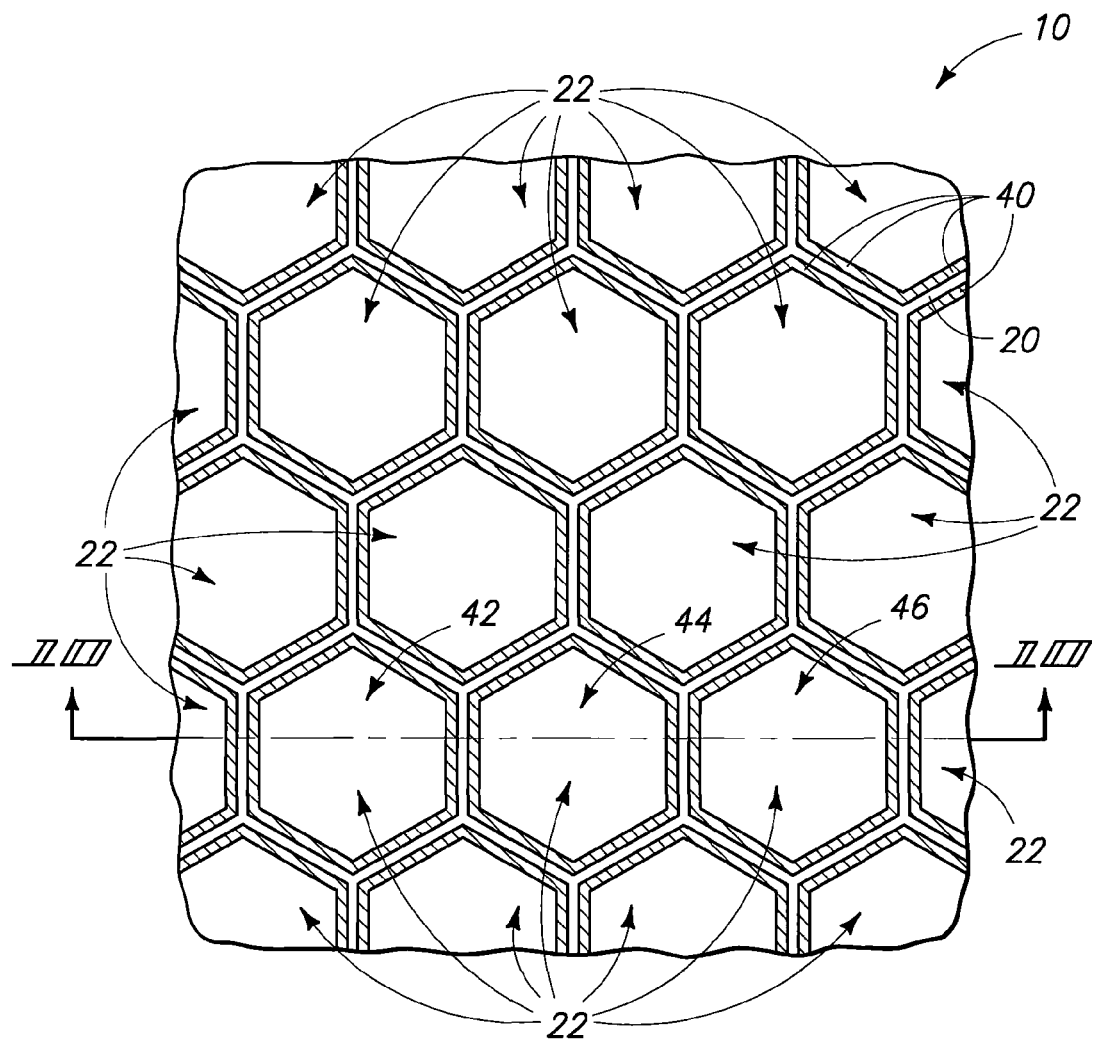

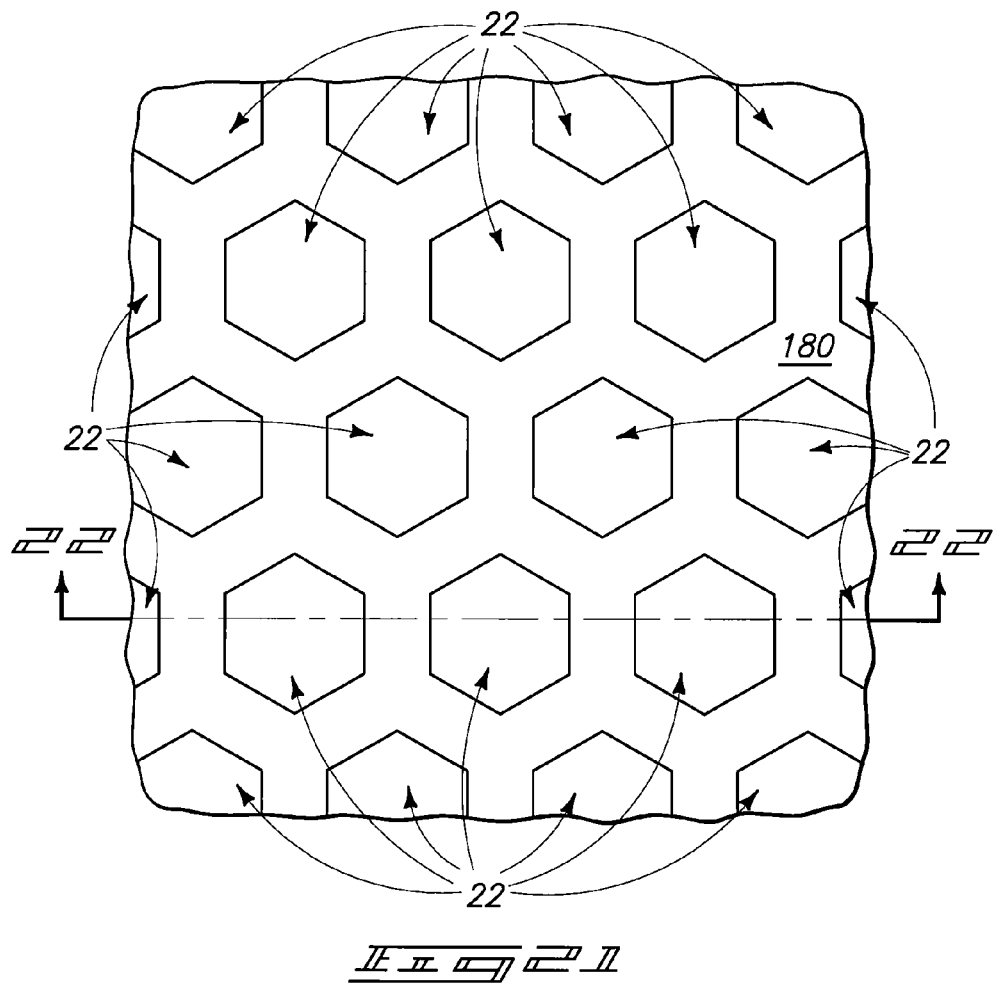
_FIG_21
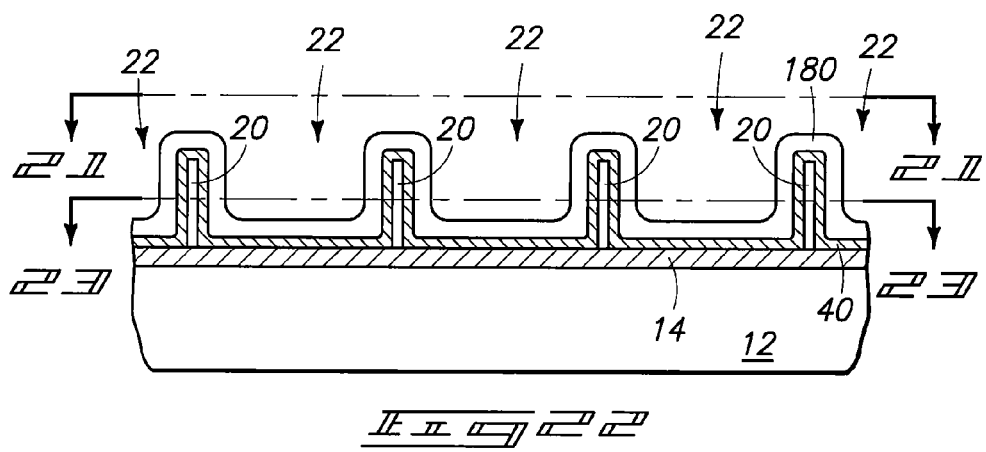
_FIG_22

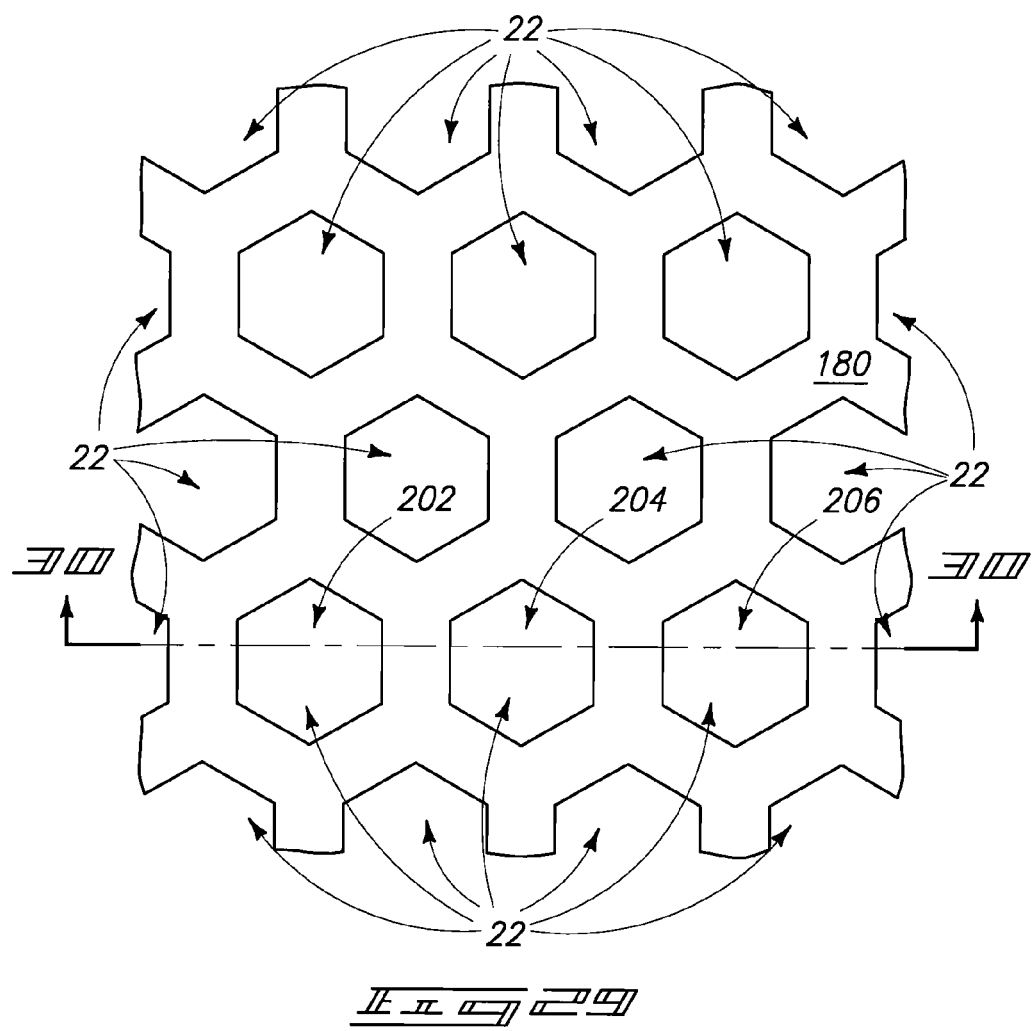
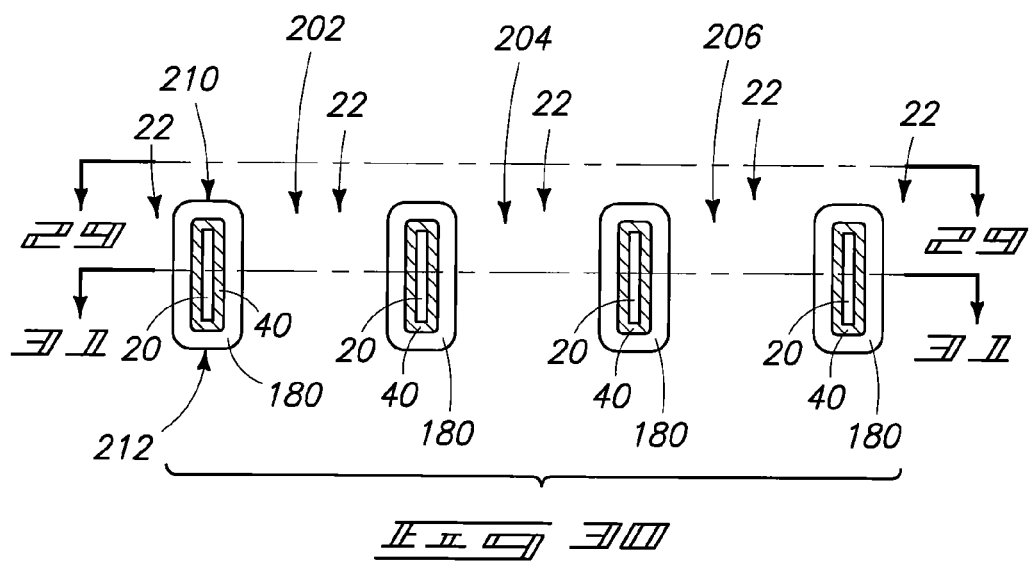

PLASMA-GENERATING STRUCTURES, DISPLAY DEVICES, AND METHODS OF FORMING PLASMA-GENERATING STRUCTURES

RELATED PATENT DATA

This patent resulted from a divisional of U.S. patent application Ser. No. 12/633,674, which was filed Dec. 8, 2009, and which is hereby incorporated herein by reference; which resulted from a divisional of U.S. patent application Ser. No. 11/777,762, which was filed Jul. 13, 2007, which is now U.S. Pat. No. 7,649,316, and which is hereby incorporated herein by reference.

TECHNICAL FIELD

Plasma-generating structures, display devices, plasma-enhanced treatments, methods of forming plasma-generating structures; methods of plasma-assisted etching, and methods of plasma-assisted deposition.

BACKGROUND

Plasmas have numerous applications in research and industry. For instance, plasmas may be utilized for one or both of plasma-assisted etching and plasma-assisted deposition during fabrication of semiconductor devices. As another example, plasmas may be utilized in analytical devices, such as mass spectrometers and inductively coupled plasma atomic emission spectroscopy (ICPAES) devices. As yet another example, plasmas may be utilized in displays to induce visible changes in phosphors or other materials.

Although there are many uses for plasmas, the utilization of plasmas has been hindered by difficulties encountered in fabricating plasma-generating structures. Such structures are often large and expensive. There have been some efforts to develop arrays of plasma-generating microstructures by micromachining. Such arrays could be useful in numerous applications if they could be cheaply produced within desired tolerances. It would be desirable to develop new methods for fabrication of plasma-generating structures that may be incorporated into existing fabrication processes, and that can form arrays of plasma-generating microstructures. It would also be desirable to develop new assemblies and uses for the plasma-generating microstructures.

BRIEF DESCRIPTION OF THE DRAWINGS

FIGS. 1 and 2 are a top view and a cross-sectional side view, respectively, of a portion of a construction at a processing stage in accordance with an embodiment. The cross-section of FIG. 2 is along the line 2-2 of FIG. 1.

FIGS. 3 and 4 are views of the portions of FIGS. 1 and 2 shown at a processing stage subsequent to that of FIGS. 1 and 2. The cross-section of FIG. 4 is along the line 4-4 of FIG. 3.

FIG. 5 illustrates an embodiment for forming the openings shown in FIGS. 3 and 4.

FIG. 6 illustrates the portion of FIG. 1 at a processing stage comparable to that of FIG. 3, and shows an embodiment alternative to that of FIG. 3.

FIGS. 9-11 are views of the construction of FIGS. 1 and 2 shown at a processing stage subsequent to that of FIGS. 3 and 4. FIGS. 9 and 10 are views of the portions of FIGS. 1 and 2, respectively, and FIG. 11 is a view along a cross-section parallel to the top view of FIG. 9. The cross-section of FIG. 10 is along the lines 10-10 of FIGS. 9 and 11, the view of FIG. 9 is along the line 9-9 of FIG. 10, and the cross-section of FIG. 11 is along the line 11-11 of FIG. 10.

FIGS. 21-23 are views of the construction of FIGS. 1 and 2 shown at a processing stage subsequent to that of FIGS. 9-11. FIGS. 21 and 22 are views of the portions of FIGS. 1 and 2, respectively, and FIG. 23 is a view along a cross-section parallel to the top view of FIG. 21. The cross-section of FIG. 22 is along the lines 22-22 of FIGS. 21 and 23, the view of FIG. 21 is along the line 21-21 of FIG. 22, and the cross-section of FIG. 23 is along the line 23-23 of FIG. 22.

FIG. 24 is a top view of a portion of the construction, and FIG. 25 is a cross-sectional side view of the portion. The view of FIG. 25 is along the line 25-25 of FIG. 24.

FIGS. 26 and 27 are views of the portions of FIGS. 24 and 25, and FIG. 28 is a view along a cross-section parallel to the top view of FIG. 26. The cross-section of FIG. 27 is along the lines 27-27 of FIGS. 26 and 28, the view of FIG. 26 is along the line 26-26 of FIG. 27, and the cross-section of FIG. 28 is along the line 28-28 of FIG. 27.

FIGS. 29-31 are views of the construction of FIGS. 24 and 25 at a processing stage subsequent to that of FIGS. 26-28. FIGS. 29 and 30 are views of the portions of FIGS. 24 and 25, and FIG. 31 is a view along a cross-section parallel to the top view of FIG. 29. The cross-section of FIG. 30 is along the lines 30-30 of FIGS. 29 and 31, the view of FIG. 29 is along the line 29-29 of FIG. 30, and the cross-section of FIG. 31 is along the line 31-31 of FIG. 30.

DETAILED DESCRIPTION OF THE ILLUSTRATED EMBODIMENTS

Figure 7:
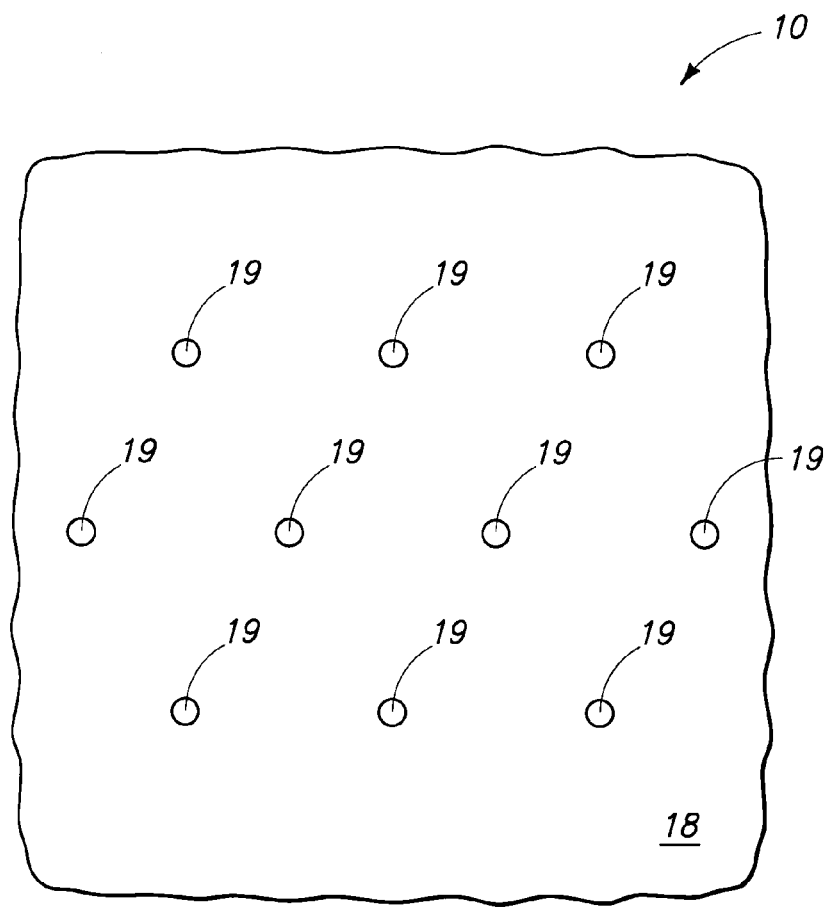
FIG. 7 illustrates the portion of FIG. 1 at a processing stage subsequent to that of FIG. 1, and prior to that of FIG. 3, in accordance with an embodiment.

Some embodiments utilize highly ordered anodic alumina nanochannel arrays as a base to build an array of hollow cathode plasma-generating structures. The plasmas formed within such structures may be high density (in other words, may comprise a density of at least $10^{11}$ ions/cm$^3$). Individual portions of the array may be independently controlled relative to other portions, and a smallest independently controlled unit may be defined as a plasma element, or plasma cell. The array of plasma-generating structures may have numerous uses, which may include utilization in various fabrication processes, display units, medical applications, remote sensor applications, chemical analysis applications, and/or material processing applications. For instance, the array of plasma-generating structures may be utilized for generating display patterns, for surface treatments, for forming electron beam arrays, for forming ion arrays, for material deposition, for material etching, for micro-chemical analysis, and/or for sterilization. Some embodiments are described with reference to FIGS. 1-33.

Referring to FIGS. 1 and 2, a portion of a semiconductor construction 10 is illustrated in top view (FIG. 1) and cross-sectional side view (FIG. 2). The construction comprises a base 12 which supports a conductive material 14, and which supports a material 18 over the conductive material 14.

The material 18 may be an aluminum-containing material, and accordingly may comprise, consist essentially of, or consist of aluminum. The aluminum-containing material 18 may have a thickness of less than 100 microns, less than 50 microns, or less than 10 microns, in some embodiments.

The base 12 may comprise semiconductor material, and may, for example, comprise, consist essentially of, or consist of monocrystalline silicon. The base may be considered to be at least part of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc. . . .

The material 14 may comprise any suitable electrically conductive composition or combination of compositions, and may, for example, comprise, consist essentially of, or consist of any of various metals (for instance, platinum, tungsten, titanium, etc.), metal-containing compositions (for instance, metal silicides, metal nitrides, etc.), and conductively-doped semiconductor materials (for instance, conductively-doped silicon, conductively-doped germanium, etc.). The material 14 may be electrically coupled with integrated circuitry (not shown) extending within base 12 so that current flow within material 14 may be controlled through such integrated circuitry.

In some embodiments, material 14 together with base 12 may be considered a semiconductor substrate.

Referring to FIGS. 3 and 4, construction 10 is shown after aluminum-containing material 18 (FIGS. 1 and 2) is subjected to anodization to convert material 18 to an aluminum oxide-containing material 20, and to form a plurality of openings 22 extending through the aluminum oxide-containing material. The aluminum oxide-containing material 20 may comprise, consist essentially of, or consist of aluminum oxide; and may be referred to as an aluminum oxide-containing body. The diagrams of FIGS. 3 and 4 are approximations to the actual structure of anodic alumina, and in some embodiments the anodic alumina may appear different than illustrated in FIGS. 3 and 4. For instance, in some embodiments the pores may appear more rounded with a small degree of hexagonal character, with boundaries between the cells appearing substantially hexagonal. Pore widening with a chemical etch (such as 5 volume % phosphoric acid at 30° C. for 2-15 minutes) may produce pores with more hexagonal character and thinner walls, which would be similar to those of FIGS. 3 and 4.

The openings have depths extending along a first axis 25 (shown in FIG. 4), and widths extending along a second axis 27 (shown in FIG. 3), with the second axis being approximately orthogonal to the first axis. The widths have a maximum dimension, and such maximum dimension may be from about 100 Å to about 2000 Å in some embodiments.

The anodization is shown forming openings extending through the alumina to underlying material 14, as may occur if the underlying material 14 begins anodizing (which may occur if material 14 comprises one or more of Si, Ti, Ta, Cr, etc.). In such embodiments, the anodization of material 14 may create an oxide, which may subsequently be removed to leave the structure shown in FIGS. 3 and 4. Such removal may be accomplished by, for example, a chemical etch (for instance, a phosphoric acid etch or a chromic acid etch), or by a plasma etch (for instance, sputtering with Ar). More specifically, the alumina, when fully anodized to an underlying metal 14, can have a thin alumina layer at the bottom of the pore, separating the pore and the underlying metal. This alumina at the base of the pore may be etched out with phosphoric or chromic acid (which may also cause pore widening) or with a sputter dry etch (which may maintain the pore width). Alternatively, when the aluminum is fully anodized, converted to alumina, and if 14 is a suitable "valve" metal, then further anodization of the system may result in the pore extending through the total alumina thickness, with a new oxide front and continuation of pore forming in the underlying metal. This new oxide of metal 14 can be removed with a suitable dry or wet etch tailored to that oxide.

The anodization may be conducted with an apparatus of the type shown in FIG. 5 as apparatus 30. Such comprises a vessel 32 retaining an electrolytic solution 34. Construction 10 is provided within such solution as an anode, and a cathode 36 is also provided within the solution. A power source 38 is utilized to provide sufficient power between the anode and the cathode to cause anodization of the aluminum-containing material associated with the anode.

The cathode 36 may comprise any suitable material, and may, for example, comprise, consist essentially of, or consist of platinum or graphite.

The composition and temperature of solution 34 may be tailored to form the openings 22 to a desired size within a desired time period. For instance, the anodization media may comprise various acids, such as sulfuric acid, phosphoric acid or oxalic acid. A temperature of the anodization media may be below about 20° C., and in some embodiments may be about 4° C. The low temperature may avoid localized heat build-up at an anodization front, which could otherwise lead to non-uniform anodization.

Pore size (or diameter), $d_{pore}$, and pore spacing, $d_{cell}$, of the anodized material may be influenced by the acid electrolyte used, and by the voltage at which the anodization is carried out. These two influences may be tied together, and thus there may be a particular voltage that works particularly well for a given electrolyte composition. Pore diameter may vary with applied voltage by between about 0.5 nm/V (nanometer per volt) and 1 nm/V, and may also depend somewhat on the acid (and acid concentration) used, with an order of increase of some example acids being: sulfuric<oxalic<phosphoric. Independent of electrolyte, the interpore spacing may increase by from about 2 nm/V to about 3 nm/V. The ratio $d_{pore}/d_{cell}$ may be at least partially controlled by electric field strength, with the ratio decreasing at higher field strengths.

The anodization may comprise a multi-step process. Initially, a first anodization may be conducted to form initiation points of the openings. Once the initiation points of the openings are formed, a top surface of aluminum oxide may be stripped with a chromic acid etch, and subsequently the openings may be further extended into or through aluminum-containing material 18 (FIGS. 1 and 2) with additional anodization. The anodization may ultimately convert all of the aluminum of material 18 to alumina (i.e., aluminum oxide).

The stripping of the top surface of the aluminum oxide may be accomplished with any suitable process, and may, for example, be accomplished utilizing a mixture of phosphoric acid and chromic acid (for instance, the etching solution may be made by mixing 20 grams of chromic acid with 35 milliliters of 85% phosphoric acid, followed by dilution of the mixture to 1 liter with deionized water at 85° C.). Another etching chemistry that may be utilized is 175 grams/liter chromic acid mixed equally with 35 grams/liter sulfuric acid at 50° C.

Referring again to FIG. 3, the anodization has formed openings 22 to be hexagonal, as is conventional for anodization of aluminum. The openings are in a hexagonally closest-packed arrangement. A possible mechanism for the pore organization into the hexagonally-closest packed arrangement is that competition for anodizing volume, and resultant stress fields, cause the pores to coalesce and align in the most efficient manner, which is a hexagonal closest-packed arrangement.

In some embodiments, the openings will be in an approximately hexagonally closest-packed arrangement, rather than in the perfect arrangement shown in FIG. 3. An approximately hexagonally closest-packed arrangement is an arrangement which is primarily hexagonally closest-packed, but which may deviate from perfect hexagonal closest-packing due to practical constraints in achieving a hexagonal closest-packed arrangement, with such constraints including, for example, practical limitations in the homogeneity of the starting aluminum-containing material in purity, crystalline orientation, etc.; and practical limitations in the homogeneity of the exposure of the aluminum-containing material to anodization conditions during the anodization process of, for example, FIG. 5. Deviations from perfect hexagonal periodicity may also be caused by variations in local chemical gradients (chemical diffusion), as well as local variations in temperature due to inhomogeneous cooling, and/or local reaction rates (due to variations in anodization conditions).

The aluminum-containing material 18 (FIGS. 1 and 2) may be comprised of numerous individual crystalline grains. Such grains will join to one another at interfaces (or boundaries). The anodization may produce hexagonally closest-packed arrangements within the individual grains, with the arrangement associated with one grain being out of alignment relative to an arrangement associated with an adjacent grain, as is diagrammatically illustrated in FIG. 6. Specifically, approximate locations of grain boundaries are illustrated with lines 23, and hexagonal closest-packed arrangements within different grains are shown to be slightly out of alignment relative to one another so that the hexagonal closest-packed arrangements do not form patterns extending across the grain boundaries. The embodiment of FIG. 6 may still have hexagonal closest-packed openings extending across the majority of a total area of an aluminum oxide-containing body, but the hexagonal closest-packed openings will be distributed amongst a plurality of separate and non-interlocking arrangements. The deviations of FIG. 6 of having some hexagonally closest-packed arrangements out of alignment relative to others may also result from other influences in addition to, or alternatively to, grain boundaries.

One method of forcing a hexagonal closest-packed arrangement to extend across grain boundaries is described with reference to FIG. 7. Specifically, a plurality of divots or dents 19 are imparted to a surface of aluminum-containing material 18 prior to the anodization. The dents are in a pattern corresponding to the centers of hexagonally closest-packed openings desired to be formed during the anodization. The dents may provide starting points for the anodization occurring within material 18, and accordingly may force a pattern of hexagonal closest-packing to extend across an entirety of the oxide formed from material 18, including extending across grain boundaries. The dents may be formed by any suitable method. An example method is to press a template against material 18. Another example method is to provide a patterned mask over material 18, and subsequently transfer a pattern from the mask into material 18 with a suitable etch. Another method is to use ion beam etching. In some embodiments, pore patterns may be induced into desired geometries from bottom-up using pits in an aluminum substrate. In some embodiments, pits or posts may be made in or under the material 14 underlying the aluminum, and then the aluminum may be deposited over this textured base to create a topography along the bottom of the aluminum that may be used to induce a pattern in the aluminum.

Other patterns of the pores, besides hexagonal closest-packing may be induced with an appropriate template of divots or pits across an aluminum substrate. For instance, square or triangular patterns may be induced with appropriate templating.

In the embodiment of FIGS. 3 and 4, openings 22 penetrate entirely through aluminum oxide-containing material 20 to the underlying conductive material 14. Such may be accomplished in a single anodization step if material 14 is conducive to the anodization. In such embodiments, the anodization may extend openings 22 at least partially into material 14. In other embodiments, the anodization may extend openings 22 only partially through aluminum oxide-containing material 20 to leave a film of aluminum oxide-containing material across a bottom of the openings.

Figure 8:
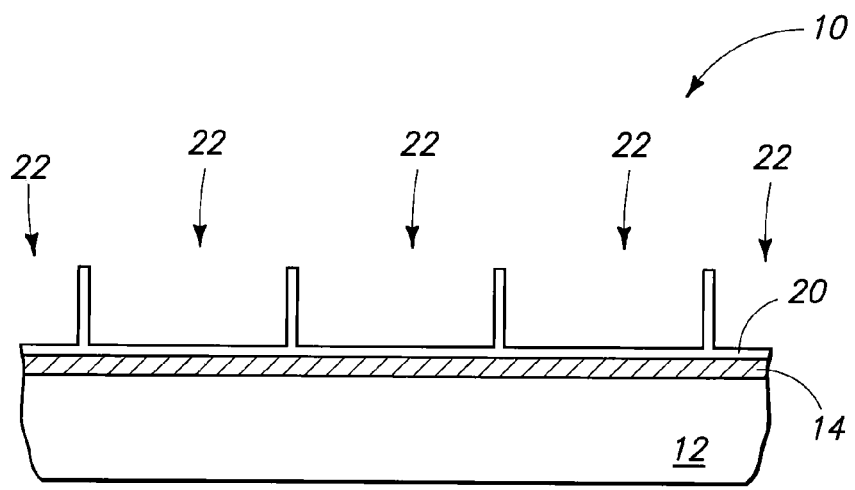
FIG. 8 illustrates the portion of FIG. 2 at a processing stage subsequent to that of FIG. 2, and prior to that of FIG. 4, in accordance with an embodiment.

FIG. 8 illustrates an embodiment in which the anodization has formed openings 22 to extend only partially through aluminum oxide-containing material 20. A film of the aluminum oxide-containing material remains along bottoms of the openings 22. In subsequent processing, such film may be removed by a dry etch, or a wet etch, to form the construction of FIG. 4. Alternatively, the oxide may be left at the bottoms of the openings so that the openings 22 extend into, but not through, aluminum oxide-containing material 20.

Referring next to FIGS. 9-11, electrically conductive material 40 is deposited over aluminum oxide-containing body 20 and within openings 22. The conductive material 40 may comprise any suitable composition or combination of compositions; and may, for example, comprise one or more of various metals, metal-containing compositions and conductively-doped semiconductor materials. In some embodiments, material 40 may comprise, consist essentially of, or consist of titanium nitride.

The material 40 lines openings 22, and forms hollow cathodes within the openings. Some of the hollow cathodes are labeled 42, 44 and 46 in FIGS. 9-11.

The hollow cathodes may be referred to as plasma-generating structures. Specifically, energy may be provided to the conductive material 40 sufficient to generate plasmas within the hollow cathodes, and to maintain such plasmas for a desired duration. The energy may be radiofrequency (RF) energy to form inductively-coupled plasmas or capacitively-coupled plasmas. In forming inductively-coupled plasmas, the RF coupling mechanism may be primarily one of inductive nature, and in forming capacitively-coupled plasmas the RF coupling mechanism may be primarily one of capacitive nature. In some embodiments, the plasmas may be high-density plasmas.

Figure 12:
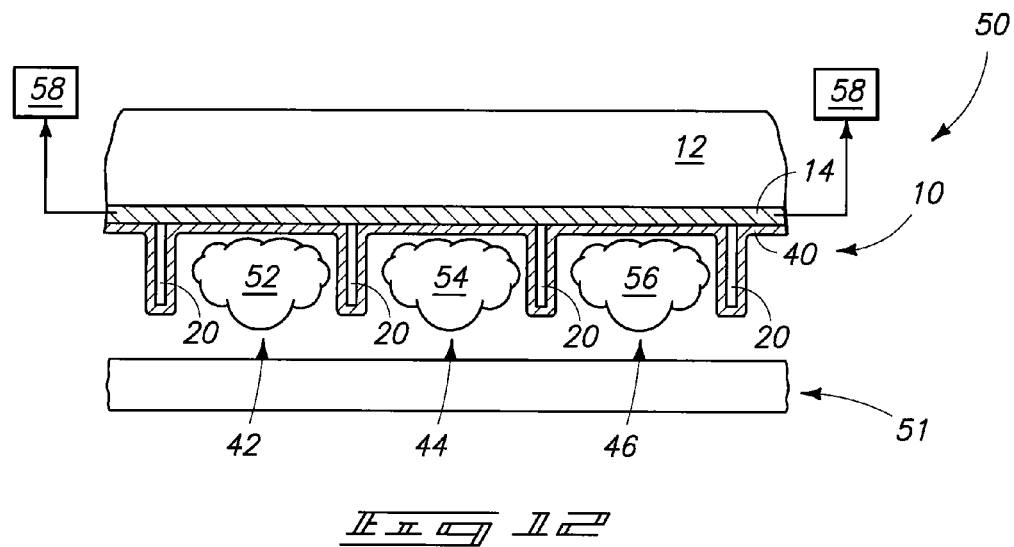
FIG. 12 is a diagrammatic, cross-sectional view of an assembly utilized to treat a substrate in accordance with an embodiment.

FIG. 12 shows an assembly 50 comprising construction 10 inverted over a substrate 51. Plasmas 52, 54 and 56 are generated and maintained within hollow cathodes 42, 44 and 46, respectively. In some embodiments, current is passed to conductive material 40 from conductive material 14 to provide the energy that generates and maintains the plasmas. Current flow through material 14 is controlled by circuitry 58 that is diagrammatically illustrated in FIG. 12. Such circuitry may be at least partially comprised by integrated circuitry associated with semiconductor base 12, and in some embodiments may be wholly comprised by such integrated circuitry. The circuitry may have a layout of components similar to that described in J. Hopwood et. al. "*Fabrication and Characterization of a Micromachined 5 mm Inductively Coupled Plasma Generator*" *J. Vac. Sci. Technol. B*. 18(5), pp. 2446-2451 September/October 2000.

The plasmas 52, 54 and 56 may be referred to as microplasmas, in that they are very small (with each being less than a thousand angstroms in maximum cross-sectional dimension in some embodiments). The individual micro-plasmas may be maintained with less than or equal to about one watt of RF power in some embodiments.

Substrate 51 may comprise any substrate desired to be treated with a plasma-enhanced treatment method. For instance, the substrate may correspond to a medical device which is to be sterilized, and/or to a region of a patient which is to be sterilized; may correspond to a semiconductor substrate which is to be subjected to plasma-enhanced deposition or etching; may correspond to a material which is to receive ion beams or electron beams generated by a plasmas to stimulate a visible change within the material to create a display; and/or may correspond to a material which is to be subjected to chemical analysis, or other analysis, utilizing the plasmas.

Substrate 51 may be directly against construction 10, or may be spaced from the construction by a gap (as shown). If substrate 51 is spaced from construction 10 by a gap, such gap may be, for example, less than or equal to about 5 millimeters.

Figure 13:
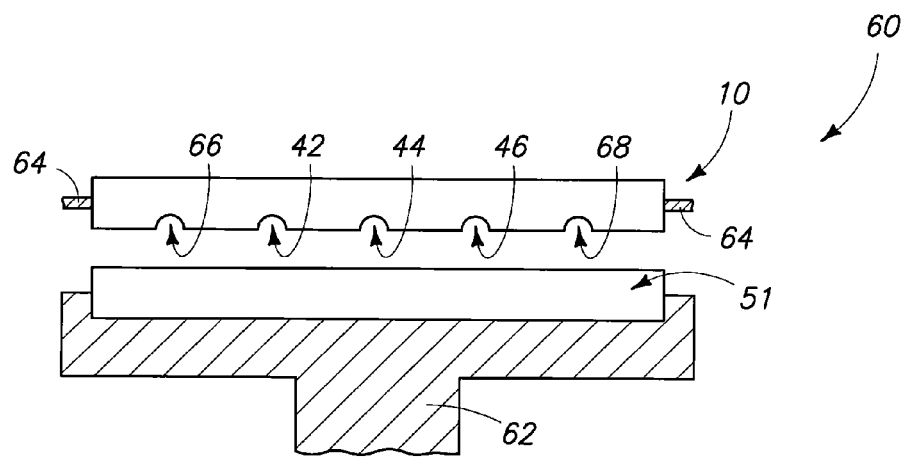
FIG. 13 is a diagrammatic, cross-sectional view of another assembly utilized to treat a substrate in accordance with an embodiment.
Figure 14:
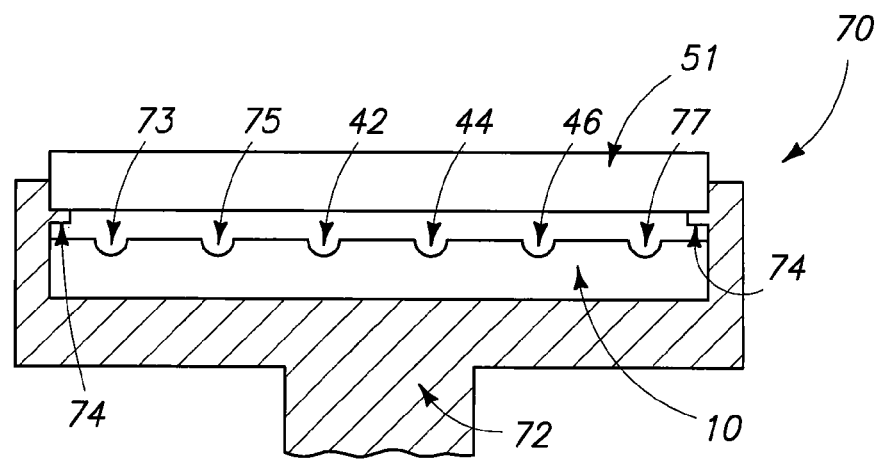
FIG. 14 is a diagrammatic, cross-sectional view of another assembly utilized to treat a substrate in accordance with an embodiment.

The substrate may be retained in a desired orientation relative to the plasma-generating structures utilizing any suitable assembly. FIGS. 13 and 14 illustrate example assemblies which may be utilized. In referring to FIGS. 13 and 14, similar numbering will be used as is utilized above in describing FIG. 12, where appropriate.

FIG. 13 shows an assembly 60 comprising construction 10 (shown more diagrammatically in FIG. 13 than in FIG. 12) retained above substrate 51. The substrate is retained in a substrate holder 62, and construction 10 is retained by a holder 64. The construction 10 comprises hollow cathodes 42, 44 and 46, and additionally comprises another pair of hollow cathodes 66 and 68. Although five hollow cathodes are shown, there may be many more hollow cathodes in other embodiments, and there may, for example, be hundreds, thousands, or more hollow cathodes.

FIG. 14 shows an assembly 70 in which construction 10 is retained within a substrate holder 72. The construction 10 and substrate holder may together be considered a chuck suitable for retaining a substrate. The substrate holder comprises a lip 74 which holds the substrate 51 in an elevated position above construction 10, with a gap being between the substrate and the construction 10. The construction 10 comprises the hollow cathodes 42, 44 and 46 discussed above, and additionally comprises hollow cathodes 73, 75 and 77 in the shown embodiment. The embodiment of FIG. 14 has a portion of a substrate-retaining structure 72 below the substrate 51 retained in the structure, and has an entirety of the plurality of hollow cathode plasma-generating structures 42, 44, 46, 73, 75 and 77 below the substrate 51.

In the embodiment of FIG. 12, all of the plasma-generating structures 42, 44 and 46 form plasmas simultaneously. In other embodiments, one or more plasma-generating structures may be separately controlled relative to others. The plasma-generating structures having plasma therein may be referred to as being lit, and the plasma-generating structures that do not have plasma therein may be referred to as being unlit. The separate control of one or more plasma-generating structures relative to others may enable a plurality of plasma-generating structures to form a pattern of lit and unlit structures. Such pattern may enable the plurality of plasma-generating structures to form a treatment pattern across a substrate, and/or to form a display pattern within a screen.

In embodiments in which one or more plasma-generating structures are separately controlled relative to others, the smallest controlled unit of plasma-generating structures may be referred to as a plasma element. In some embodiments, a plasma element may correspond to a single plasma-generating structure. In other embodiments, the plasma element may correspond to two or more individual plasma-generating structures.

Figure 15:
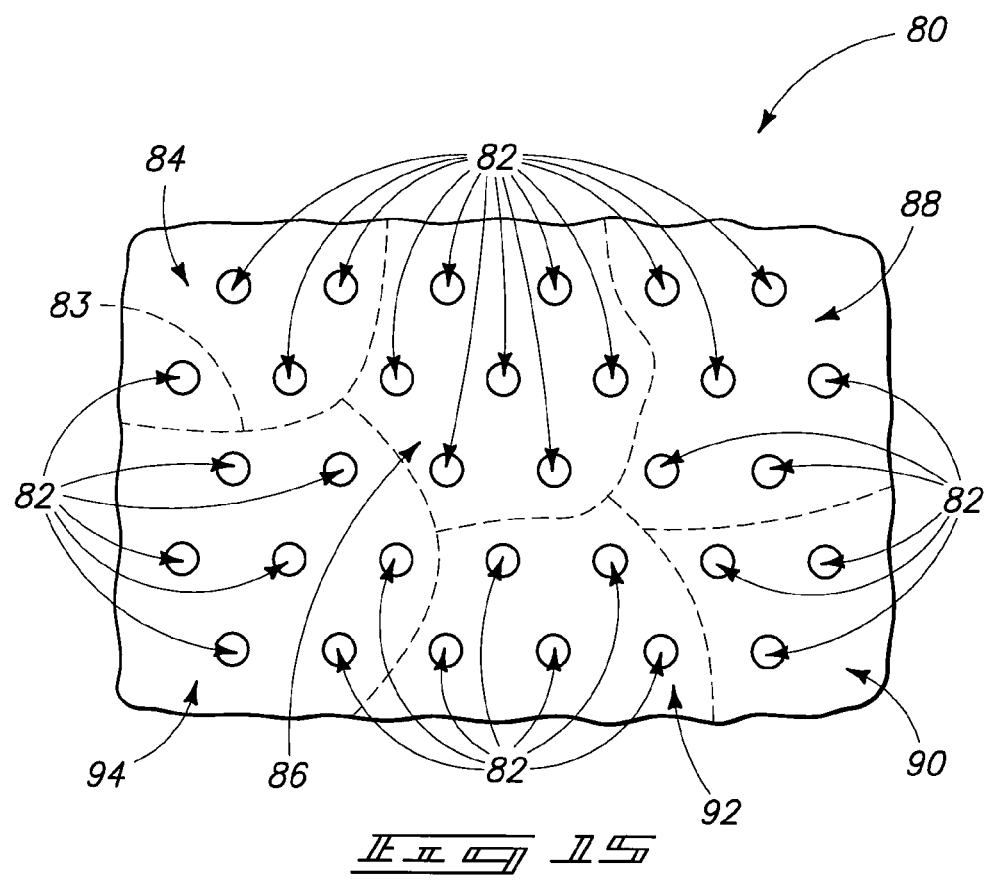
FIG. 15 is a top view of a construction comprising a plurality of plasma-generating structures in accordance with an embodiment.

FIG. 15 shows a top view of a construction 80 comprising a plurality of plasma-generating structures 82. The plasma-generating structures may be hollow cathodes formed within alumina, and thus construction 80 may be representative of a construction identical to that shown in FIG. 9. The plasma-generating structures of FIG. 15 are arranged in sets 84, 86, 88, 90, 92 and 94; with such sets being diagrammatically bounded by dashed lines 83. Each of the sets corresponds to a separate plasma element. Thus, each set is separately controllable relative to the others so that the sets may be individually lit relative to one another. In some embodiments, the plasma-generating structures are formed as a vast array of microstructures across a sheet of aluminum. In such embodiments there may be at least 50 plasma elements, at least 100 plasma elements, at least 1000 plasma elements, at least one million plasma elements, or even more plasma elements associated with a single construction. In some embodiments, the individual plasma elements may have sizes less than 10 $micron^2$.

Figure 16:
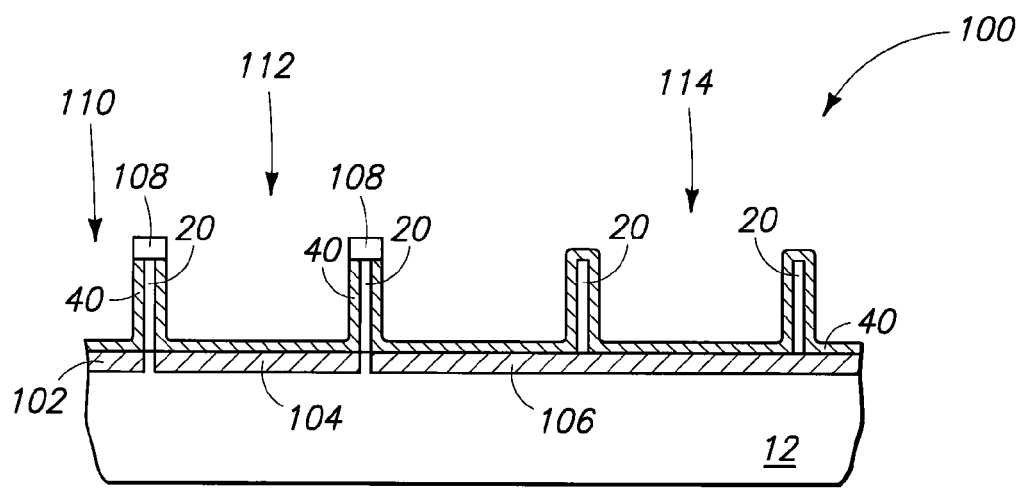
FIG. 16 illustrates the portion of FIG. 2 at a processing stage analogous to that of FIG. 10, in accordance with another embodiment.

FIG. 16 is a cross-sectional view of a portion of a construction 100 similar to the construction 10 of FIG. 10, but illustrating how multiple plasma elements may be separately controlled relative to one another. Similar numbering will be used in describing FIG. 16 as is used above in describing FIG. 10, where appropriate.

Construction 100 comprises the base 12, aluminum oxide-containing body 20, and conductive material 40 discussed above. However, in contrast to the construction of FIG. 10, construction 100 comprises a plurality of conductive layers 102, 104 and 106 electrically coupling to conductive material 40. Further, construction 100 comprises insulative material 108 forming breaks in the conductive material 40, and accordingly forming electrically isolated segments of conductive material 40. The electrically insulative material 108 may comprise any suitable composition or combination of compositions; and may, for example, comprise, consist essentially of, or consist of one or more of silicon dioxide, silicon nitride and silicon oxynitride. Material 108 may be formed with any suitable processing, including, for example, utilizing a photolithographically patterned mask to define regions where the material will be deposited; etching to remove material 40 from such regions; deposition of material 108; and subsequent removal of the mask.

The segments of conductive material 40 are incorporated into separate plasma elements 110, 112 and 114. Plasma element 112 comprises a single hollow cathode plasma-generating structure, whereas plasma element 114 comprises at least three hollow cathode plasma-generating structures. Each plasma element may be separately lit relative to the others by controlling flow of current into the electrical connectors 102, 104 and 106. Such control may utilize integrated circuitry (not shown) associated with base 12.

Figure 17:
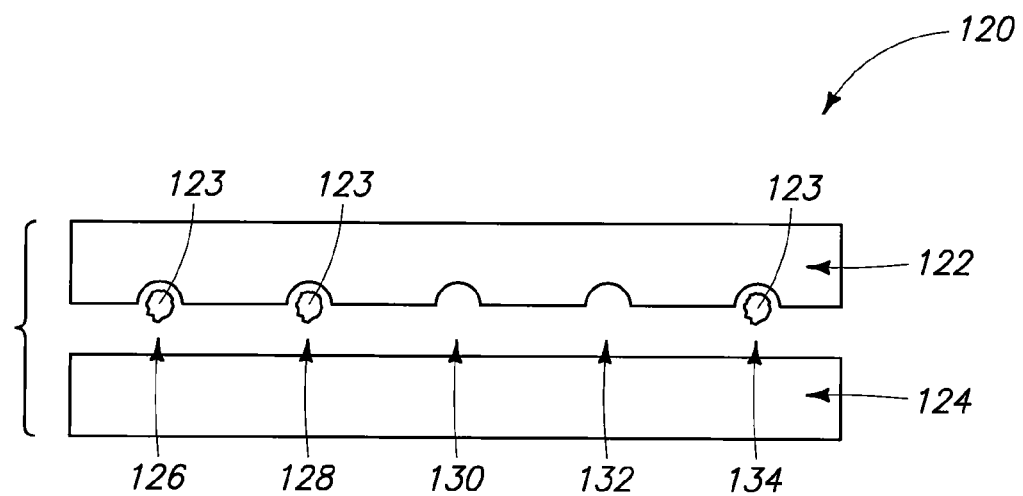
FIG. 17 is a diagrammatic, cross-sectional view of an assembly utilizing a plurality of plasma-generating microstructures to selectively treat regions of a semiconductor substrate.
Figure 18:
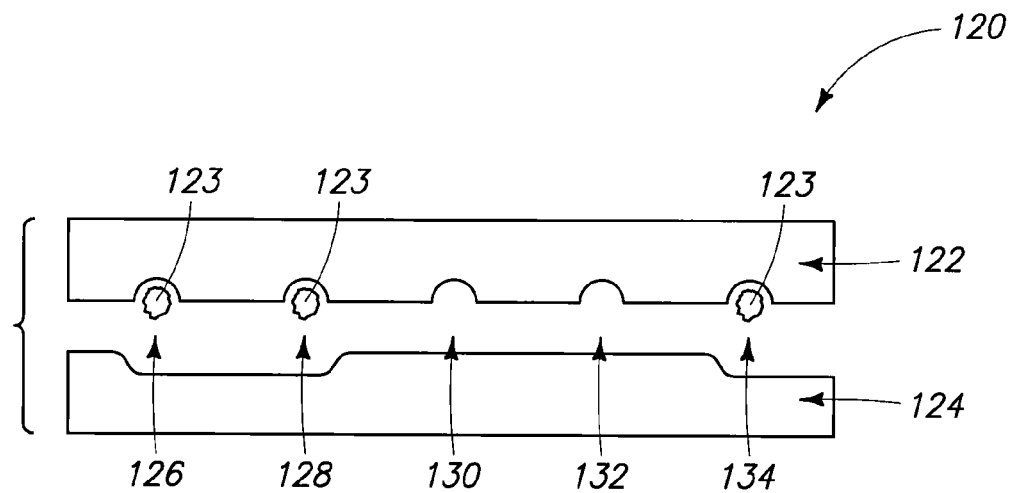
FIG. 18 is a view of the assembly of FIG. 17 shown at a stage subsequent to that of FIG. 17 in accordance with an embodiment in which the substrate is etched by plasmas formed with the microstructures.
Figure 19:
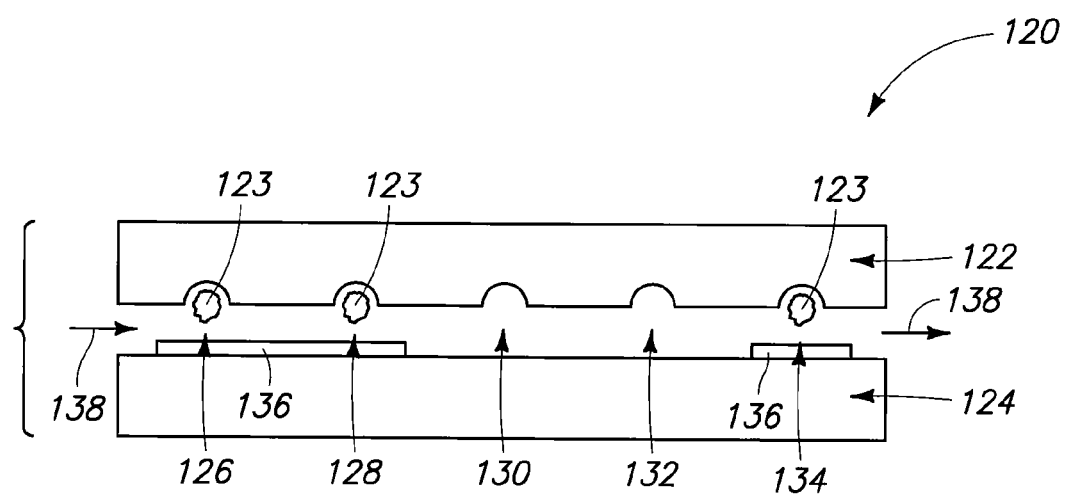
FIG. 19 is a view of the assembly of FIG. 17 shown at a stage subsequent to that of FIG. 17 in accordance with an embodiment in which material is deposited utilizing plasmas formed with the microstructures.

The control of separate plasma elements may enable numerous applications in which some portions of the substrate are treated differently than others. FIGS. 17-19 illustrate a couple of example applications.

Referring to FIG. 17, an assembly 120 comprises a plasma-generating construction 122 and a semiconductor substrate 124. The construction 122 comprises a plurality of hollow cathode plasma-generating structures 126, 128, 130, 132 and 134. Such hollow cathode plasma-generating structures may correspond to metal-lined openings extending into alumina, and accordingly may correspond to structures of the type shown in FIG. 16.

Plasmas 123 is shown to be within only some of the plasma-generating structures. Specifically, the plasma-generating structures 126, 128 and 134 are lit, and the structures 130 and 132 are unlit.

Referring to FIG. 18, assembly 120 is shown after utilization of the plasmas 123 for a plasma-assisted etch of substrate 124. Such etch may be conducted by flowing etchant material between construction 122 and substrate 124, providing a bias between construction 122 and substrate 124, and utilizing one or more species generated by plasmas 123 to perform the etch. The etching occurs in a pattern related to the pattern of the lit and unlit plasma-generating structures. Accordingly, the pattern of lit and unlit plasma-generating structures may be utilized to impart a desired etch pattern into substrate 124.

Referring to FIG. 19, assembly 120 is shown at a processing stage following that of FIG. 17, and specifically after utilization of the plasmas 123 for a plasma-assisted deposition of material 136 over substrate 124. Such deposition may be conducted by flowing reactant material 138 between construction 122 and substrate 124, providing a bias between construction 122 and substrate 124 (if desired), and utilizing plasmas 123 to enhance the deposition. The utilization of the plasmas may comprise interaction of the reactant material 138 with one or more species in the plasmas (for instance, ions) and/or with one or more species emitted by the plasmas (for instance, electrons, ions, photons, etc.; wherein the photons may correspond to ultraviolet light). The deposition occurs in a pattern related to the pattern of the lit and unlit plasma-generating structures. Accordingly, the pattern of lit and unlit plasma-generating structures may be utilized to impart a desired deposition pattern onto substrate 124.

In some embodiments, the deposited material may comprise components sputtered from the surfaces of the lit hollow cathodes 126, 128 and 134. For instance, if the surfaces comprise conductive material 40 as shown in FIG. 16, the plasmas may be generated under conditions that sputter the conductive material from such surfaces. In some embodiments, multiple materials may be formed within the hollow cathodes, with the composition exposed along sidewalls of the hollow cathodes being a composition which is desired to be sputter-deposited onto a substrate. In other embodiments, conditions may be chosen which create little sputtering from the surfaces of the hollow cathodes, so that the material deposited on the substrate is substantially entirely formed from reactant flowed between the hollow cathodes and the substrate surface. Such conditions may include forming a coating across the hollow cathodes which reduces an amount of sputtering from exposed surfaces of the hollow cathodes.

Figure 20:
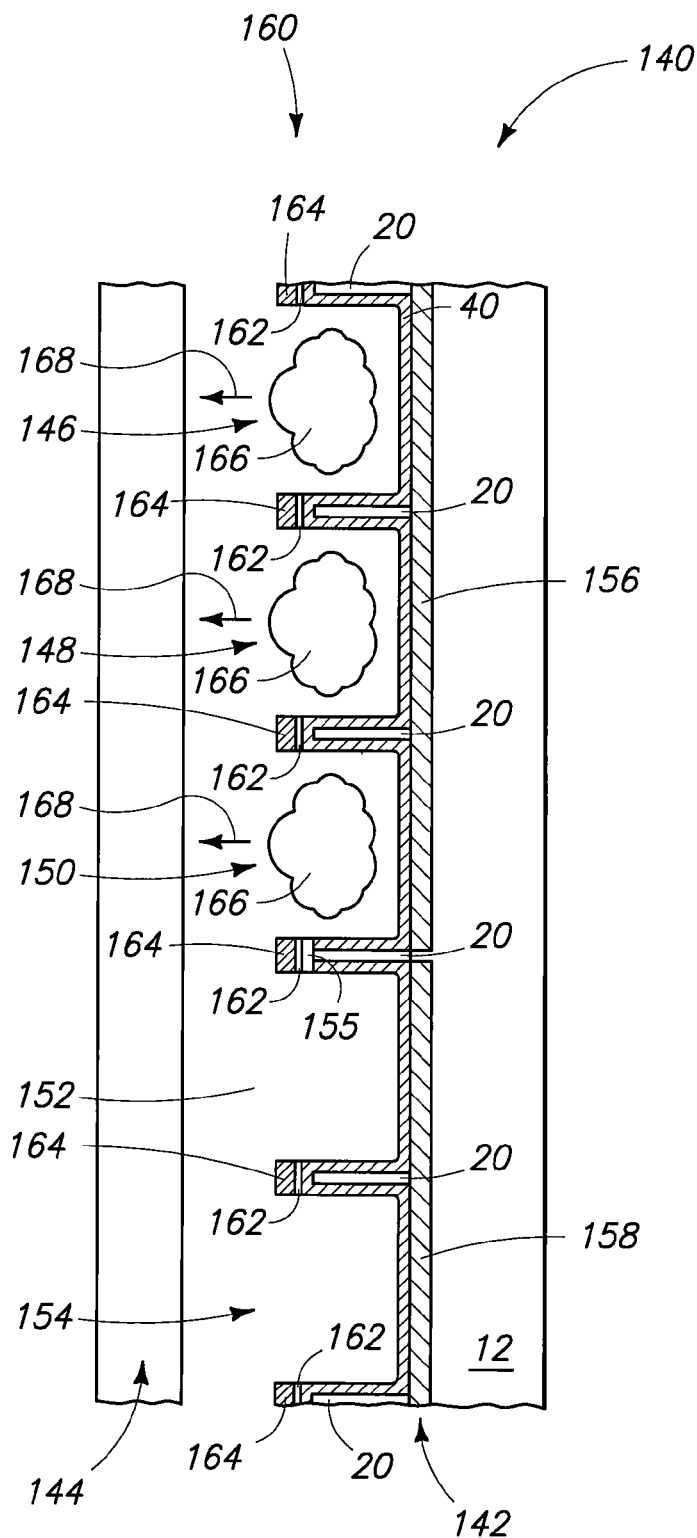
FIG. 20 is a cross-sectional side view of a portion of a display in accordance with an embodiment.

In addition to having applications for treatment of various surfaces, the control of separate plasma elements may have applications for displays. FIG. 20 shows an assembly 140 comprising a plasma-generating construction 142 and a display screen 144 proximate such construction.

The construction 142 comprises the base 12 and alumina-containing body 20 discussed above (for instance, discussed with reference to FIG. 16). The construction also comprises conductive material 40 defining hollow cathodes 146, 148, 150, 152 and 154 within the openings. An insulative material 155 electrically isolates one segment of conductive material 40 from another segment, similar to the isolation achieved by material 108 in FIG. 16. The material 155 may comprise any of the compositions discussed above relative to material 108. Construction 142 additionally comprises a conductive interconnect 156 connecting to conductive material 40 of hollow cathodes 146, 148 and 150; and comprises another conductive interconnect 158 connecting to conductive material 40 of hollow cathodes 152 and 154. Conductive interconnects 156 and 158 are connected to circuitry (not shown) which controls current flow through the interconnects. The current flow through one interconnect may be independently controlled relative to the current flow through the other interconnect. Accordingly, the hollow cathodes 146, 148 and 150 are part of one plasma element, and the hollow cathodes 152 and 154 are part of another plasma element.

A grid 160 is formed across outermost regions of construction 142 between the hollow cathodes. The grid comprises a conductive material 162, and is shown spaced from conductive material 40 by dielectric spacers 164. The grid may be utilized for focusing particles ejected from plasmas within the hollow cathodes, with example particles being electrons, ions and photons. The conductive material 162 may comprise any suitable composition or combination of compositions, and may, for example, comprise one or more of metals, metal-containing compositions, and conductively-doped semiconductor material. Dielectric material 164 may comprise any suitable composition or combination of compositions, and may, for example, comprise one or both of silicon dioxide and silicon nitride.

Screen 144 comprises one or more compositions which visually change upon being stimulated by particles emitted from plasmas proximate the screen. Such compositions may include various phosphors.

Hollow cathodes 146, 148 and 150 are shown to have plasmas 166 therein (i.e., are shown lit), while hollow cathodes 152 and 154 have no plasma therein (i.e., are shown unlit). The lit plasmas eject particles 168 toward the display screen. Such particles may be focused by grid 160. The particles emitted from a single plasma element (for instance, the elements comprising cathodes 146, 148 and 150) may correspond to a single pixel in the display screen. The pattern of the plasmas formed in the hollow cathodes may form patterns of particles (for instance, electron beam patterns or ion beam patterns) which in turn form pixel patterns in the display.

Figure 23:
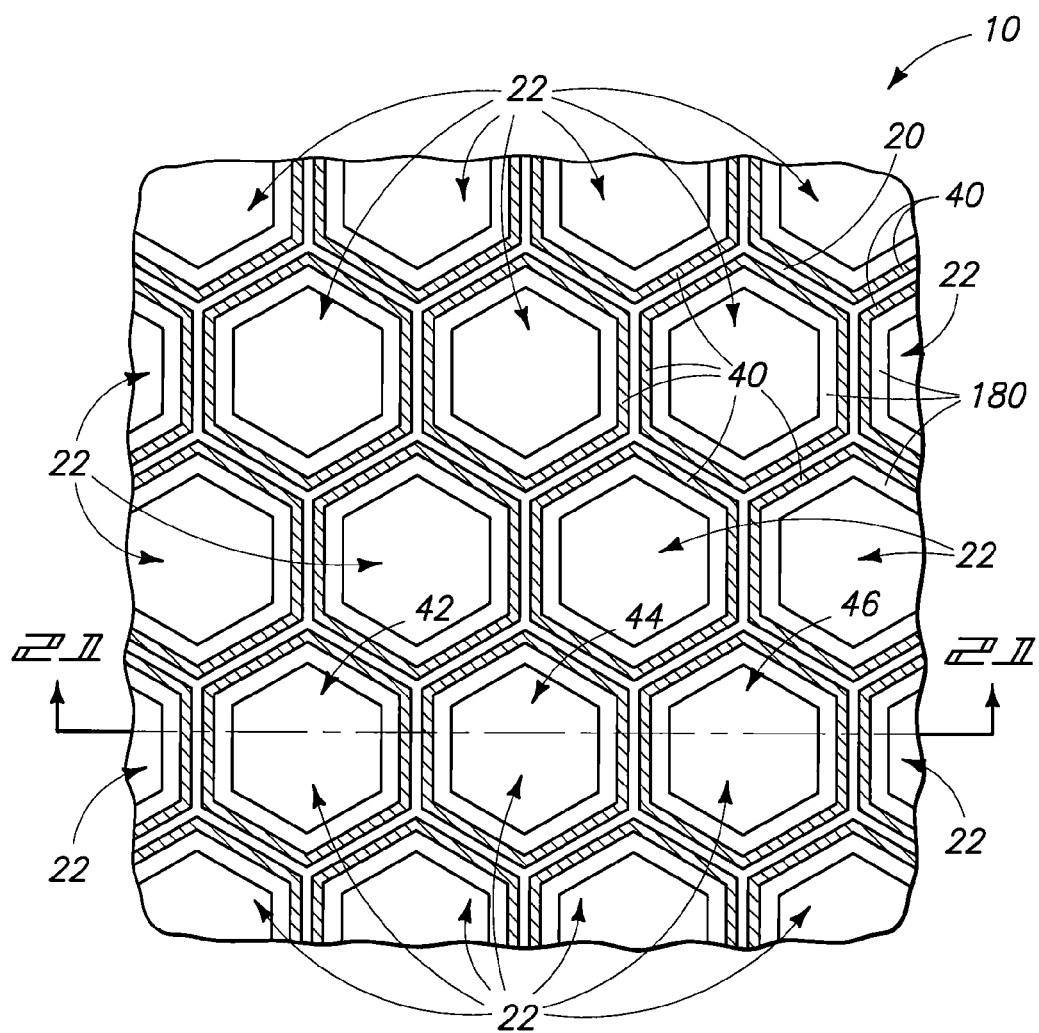

The embodiments shown in FIGS. 12, 16 and 20 have conductive material 40 as the outermost material within the hollow cathodes. In other embodiments dielectric material may be formed over the conductive material prior to generating plasmas within the hollow cathodes. FIGS. 21-23 show a processing stage subsequent to that of FIGS. 9-11 in which a dielectric material 180 is formed over the conductive material 40. The dielectric material 180 forms exposed inner surfaces of the hollow cathodes, and may protect material 40 from being sputtered by plasmas formed within the hollow cathodes. Alternatively, the dielectric material may be material which is desired to be sputter-deposited through utilization of the plasmas. The dielectric material may comprise any suitable composition or combination of compositions, and may, for example, comprise, consist essentially of, or consist of one or both of silicon dioxide and silicon nitride.

In the embodiments discussed above, the alumina body 20 is supported by a semiconductor base 12. In other embodiments, the alumina body may be formed to be self-supporting, as discussed with reference to FIGS. 24-31. In describing FIGS. 24-31, similar numbering will be used as is used above in describing FIGS. 1-4 and 21-23, where appropriate.

Figure 24:
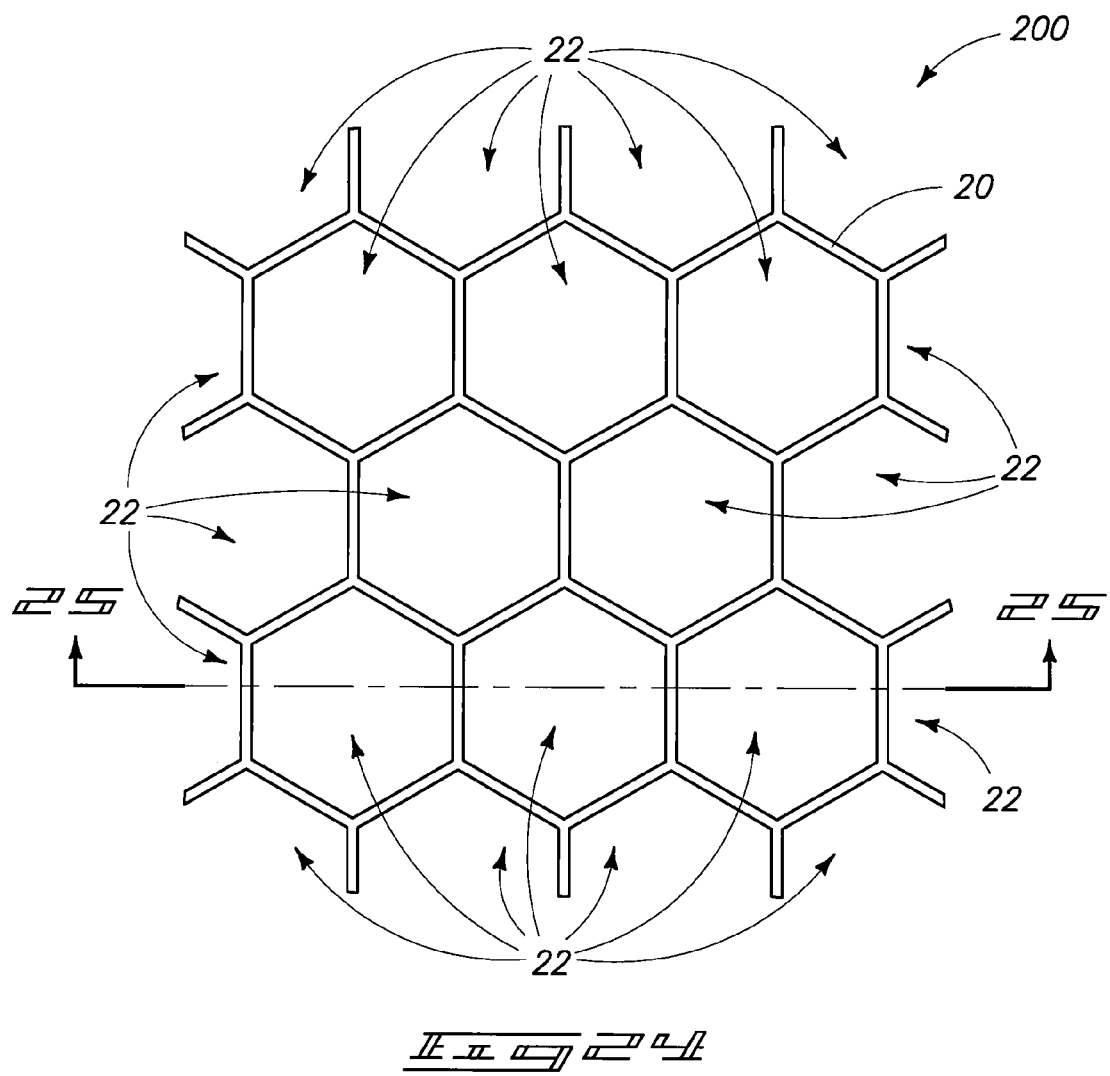
FIGS. 24 and 25 are views of a construction at a processing stage analogous to that of FIGS. 3 and 4, in accordance with another embodiment.
Figure 25:
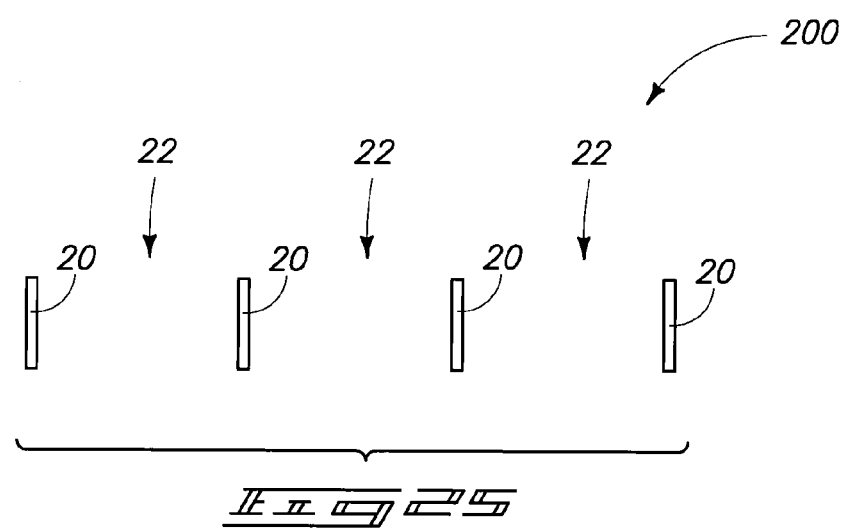

Referring to FIGS. 24 and 25, an alumina body 200 is illustrated at a processing stage similar to that of FIGS. 3 and 4, but without a supporting base. The alumina body comprises aluminum oxide-containing material 20 having openings 22 extending therethrough. Alumina body 200 may be formed utilizing anodization similar to that discussed above with reference to FIG. 5, but starting with a sheet of aluminum foil rather than with aluminum supported on a base. The alumina body 200 may have a thickness of from several microns to several millimeters.

Figure 26:
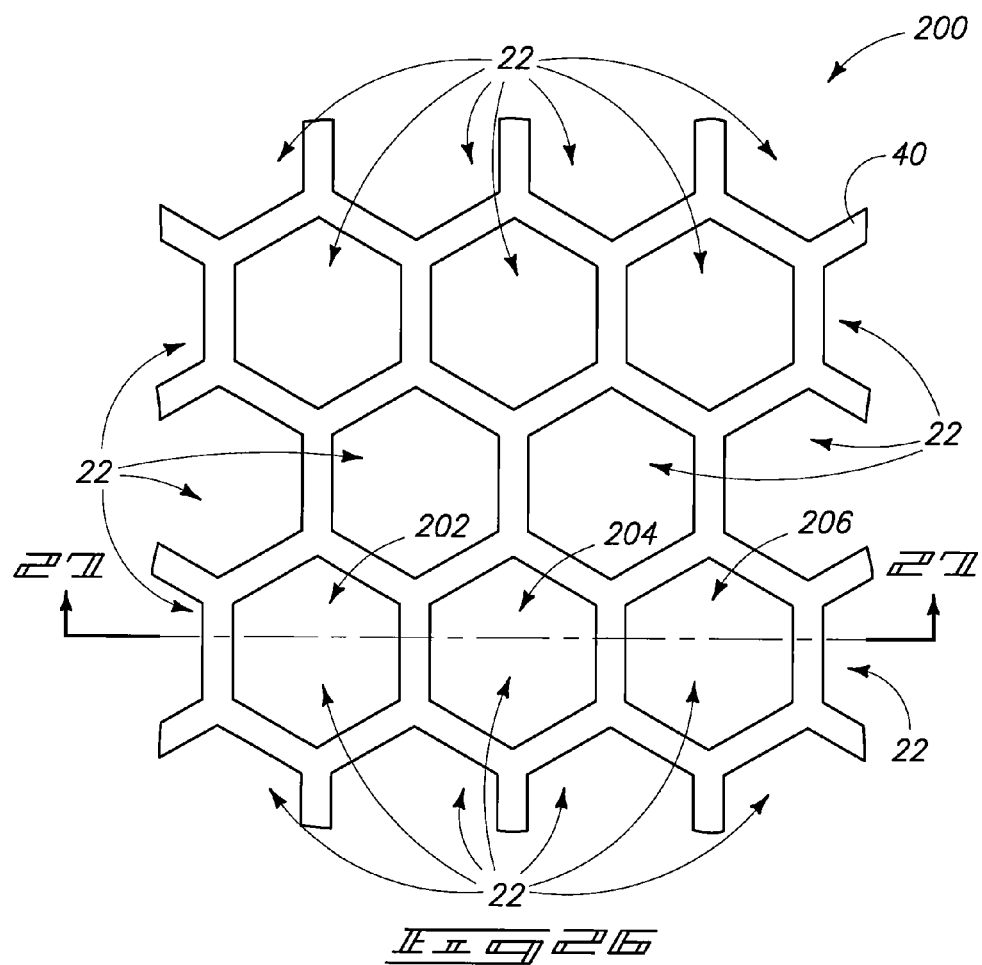
FIGS. 26-28 are views of the construction of FIGS. 24 and 25 at a processing stage subsequent to that of FIGS. 24 and 25.
Figure 27:
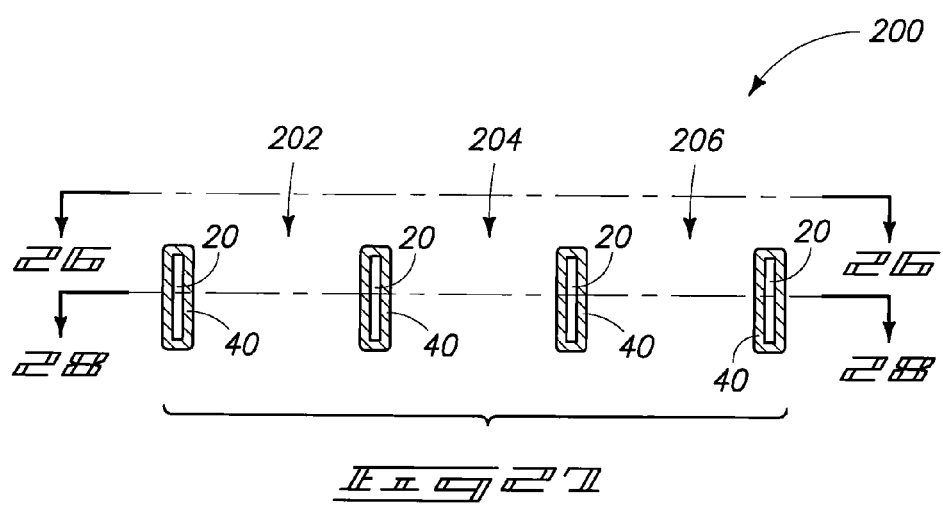
Figure 28:
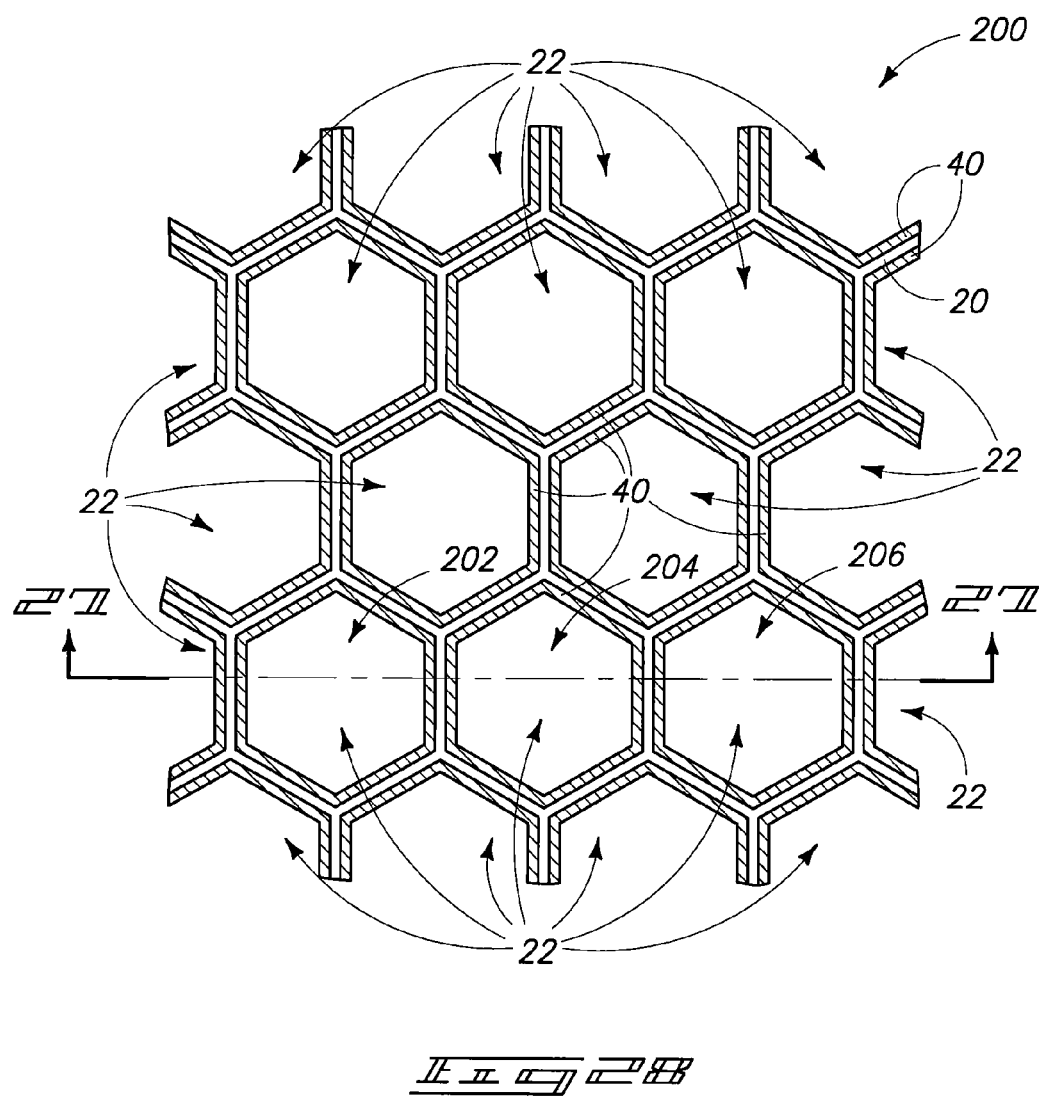

Referring to FIGS. 26-28, conductive material 40 is formed over the alumina body and within the openings to partially fill the openings (or other words, to line the openings). The conductively-lined openings form a plurality of hollow cathodes, with some of the hollow cathodes being labeled 202, 204 and 206. The hollow cathodes extend entirely through the alumina body.

Figure 31:
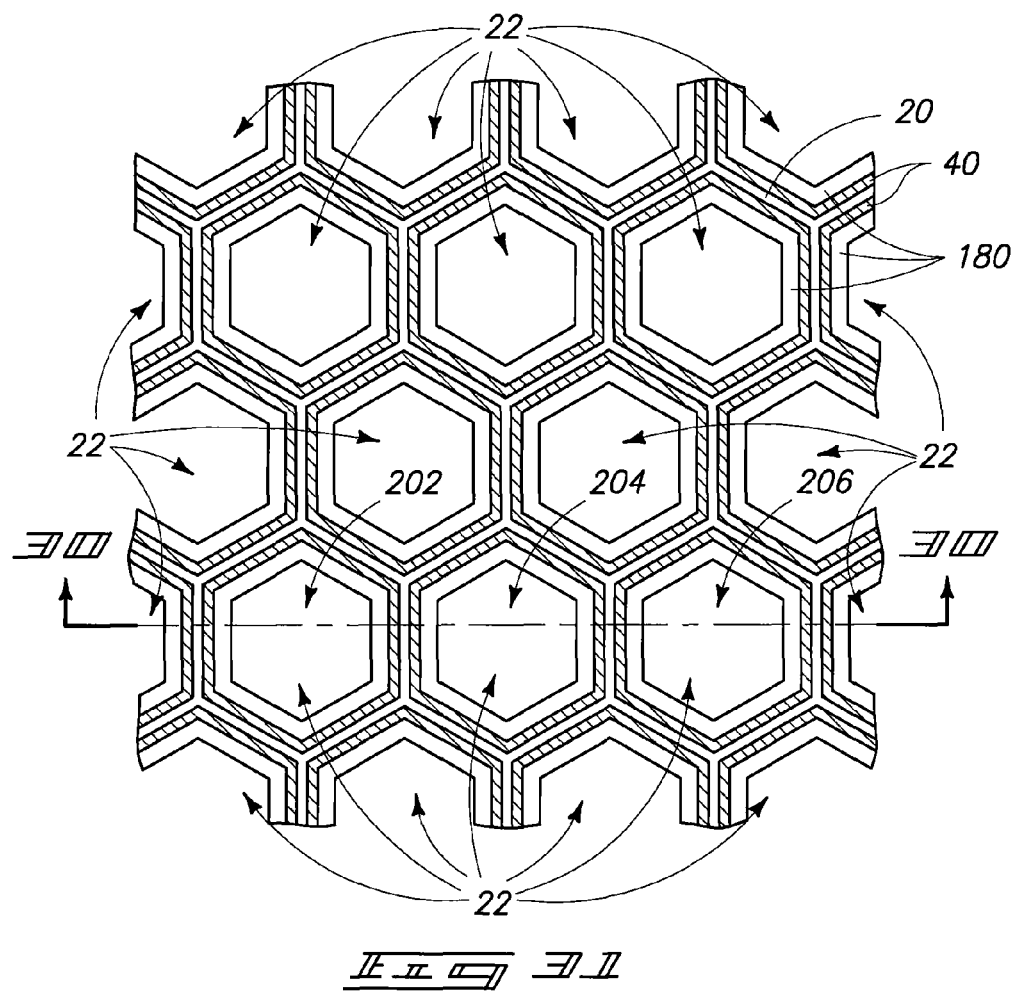

Referring to FIGS. 29-31, dielectric material 180 is formed over the alumina body 200 and within the openings 22 to partially fill the openings. In some embodiments dielectric material 180 may be omitted.

Hollow cathodes 202, 204 and 206 correspond to tubes extending entirely through body 200. The body has opposing surfaces 210 and 212 (shown in FIG. 30) through which the tubes extend. In subsequent processing, circuitry may be provided across one or both of such opposing surfaces to provide current which may generate plasmas within the hollow cathodes. Such circuitry may be configured to simultaneously form plasmas within all of the hollow cathodes, or may be configured to selectively form plasmas within some of the hollow cathodes relative to others. Some of the circuitry may be provided before formation of dielectric material 180 so that the circuitry directly contacts conductive material 40, or in other embodiments dielectric material 180 may be kept thin enough so that the circuitry may be provided after formation of dielectric material 180.

Figure 32:
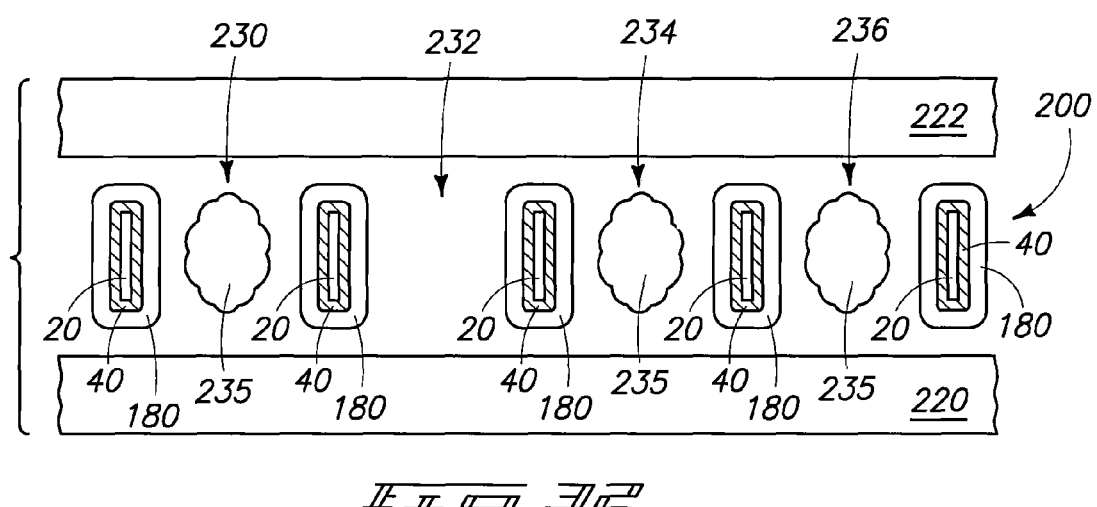
FIG. 32 is a diagrammatic, cross-sectional view of an assembly utilized to treat a substrate in accordance with an embodiment.

The constructions of FIGS. 26-28 and 29-31 are symmetric so that they may be utilized to simultaneously treat two substrates. For instance, FIG. 32 shows body 200 of FIGS. 29-31 provided between a pair of substrates 220 and 222. The body 200 comprises hollow cathodes 230, 232, 234 and 236; and plasmas 235 are shown within the hollow cathodes 230, 234 and 236. The plasmas may be utilized to simultaneously treat both of the substrates 220 and 222.

Figure 33:
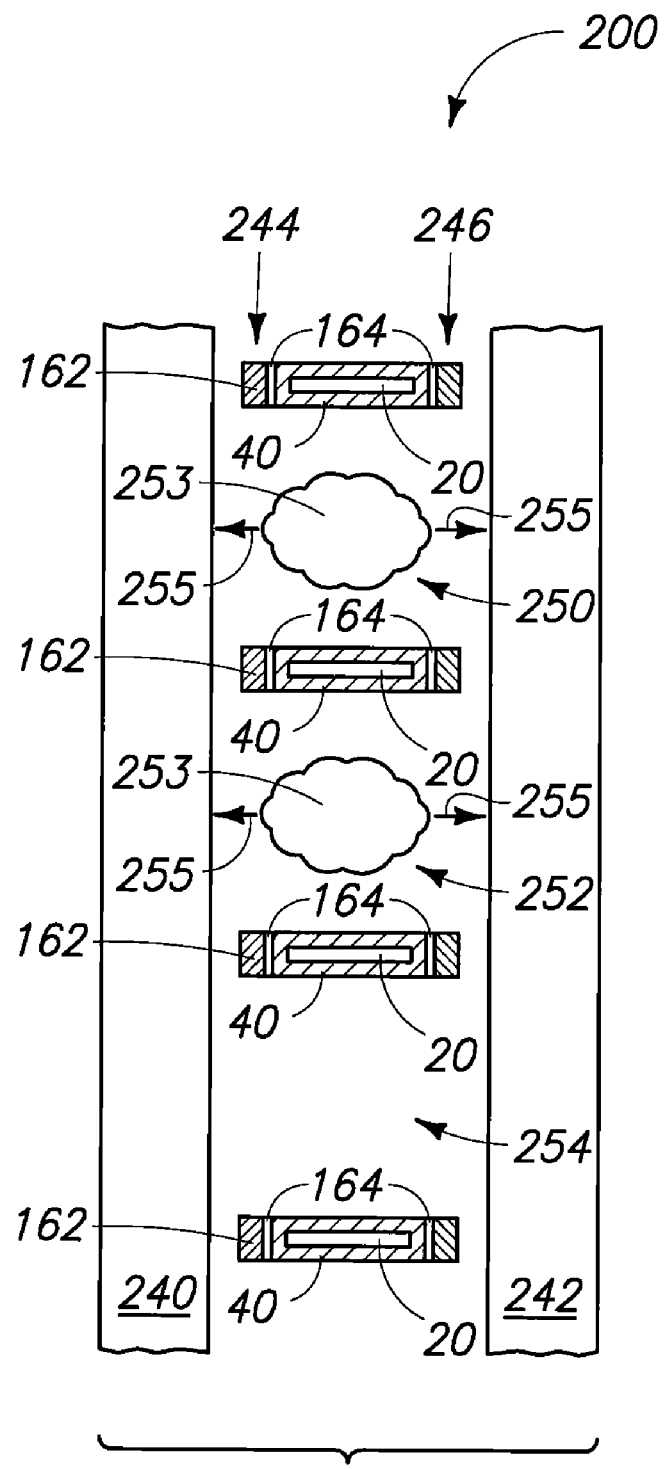
FIG. 33 is a cross-sectional side view of a portion of a display in accordance with an embodiment.

Another use for the symmetric constructions is to simultaneously display information on opposing sides of the constructions. FIG. 33 shows body 200 of FIGS. 26-28 provided between a pair of display screens 240 and 242. A pair of grids 244 and 246 are shown on opposing sides of body 200, with the grids comprising the conductive grid material 162 discussed above with reference to FIG. 20, and with such material being spaced from conductive material 40 by the dielectric material 164 discussed with reference to FIG. 20.

A plurality of hollow cathodes 250, 252 and 254 extend through body 200. Plasmas 253 are within hollow cathodes 250 and 252, but not within hollow cathode 254. The plasmas emit particles 255 that can cause visible changes within the display screens, and accordingly simultaneously activate pixels in both display screens. The assembly of FIG. 33 may be placed between a pair of rooms so that persons in one room may observe the same display as persons in an adjacent room. It is noted that the display in screen 242 will be a mirror image of the display in screen 240, which may have advantages in some situations.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A construction containing a plurality of plasma-generating structures, comprising:
   a body having a plurality of openings extending therein, the body predominantly comprising aluminum oxide;
   electrically conductive material lining the openings, the electrically conductive material forming hollow cathodes; and
   circuitry controlling current flow through the electrically conductive material, the circuitry being configured to provide current flow that generates and maintains plasma within one or more of the hollow cathodes.

2. The construction of claim 1 wherein the openings are in an approximate hexagonally-closest-packed arrangement across a majority of a total area of the body.

3. The construction of claim 2 wherein the lined openings have depths along a first axis and widths along a second axis approximately orthogonal to the first axis, and wherein the widths have a maximum dimension of from about 100 Å to about 2000 Å.

4. The construction of claim 1 further comprising dielectric material within the openings and over the electrically conductive material.

5. The construction of claim 1 wherein the body consists of aluminum oxide.

6. The construction of claim 1 wherein the openings extend entirely through the body.

7. The construction of claim 6 wherein the body is supported by a semiconductor base, and wherein at least some of the circuitry is integrated with the semiconductor base.

8. The construction of claim 1 wherein a smallest unit independently controlled by the circuitry is defined as a plasma element, and wherein individual hollow cathodes correspond to plasma elements.

9. The construction of claim 1 wherein a smallest unit independently controlled by the circuitry is defined as a plasma element, and wherein the individual plasma elements contain two or more individual hollow cathodes.

10. The construction of claim 9 wherein there are at least 1000 of said plasma elements.

11. A display device, comprising:
a display screen comprising plasma-activated pixels;
a plurality of plasma-generating structures proximate the display screen and configured to controllably activate the pixels, the plasma-generating structures being within openings extending through a dielectric material body; and
circuitry controlling current flow through the plasma-generating structures, the circuitry being configured to provide current flow that generates and maintains plasmas within the plasma-generating structures.

12. The display device of claim 11 wherein the openings are approximately hexagonally closest-packed.

13. The display device of claim 11 wherein the plasma-generating structures are hollow cathodes, and wherein conductive material lines the openings and forms conductive walls of the hollow cathodes.

14. The display device of claim 13 wherein the conductive material comprises titanium nitride.

15. The display device of claim 13 further comprising an insulative material liner within the openings, over the conductive material liner, and forming exposed inner surfaces within the openings.

16. The display device of claim 11 further comprising a grid extending adjacent the plasma-generating structures and configured to direct electrons formed by plasmas within the plasma-generating structures.

17. The display device of claim 11 wherein the plasma-generating structures are tubes extending through the body, wherein the display screen is a first display screen proximate one side of the body, further comprising a second display screen proximate a second side of the body in opposing relation to said one side, and wherein the body and display screens are configured such that plasmas within a plasma-generating structure simultaneous activate pixels in both the first and second display screens.

18. The display device of claim 11 wherein the dielectric material body consists of aluminum oxide.

19. A method of forming a plurality of hollow cathode plasma-generating structures, comprising:
forming a plurality of openings extending into a body, the body comprising aluminum oxide;
forming electrically conductive liners within the openings; and
forming circuitry to control current flow through the electrically conductive liners, the circuitry being configured to provide current flow that generates and maintains plasmas within the lined openings.

20. The method of claim 19 wherein the openings extend through the body.

21. The method of claim 19 further comprising forming dielectric material across the conductive material within the openings prior to generating plasmas within the openings.

22. The method of claim 19 wherein the body consists of aluminum oxide.

23. The method of claim 19 wherein the forming the body comprises anodization of aluminum.

24. The method of claim 19 wherein at least some of the openings are formed to be in a hexagonally closest-packed arrangement.

25. The method of claim 24 wherein the openings in the hexagonally closest-packed arrangement have depths along one axis and widths along another axis approximately orthogonal to the first axis, and wherein the openings in the hexagonally closest-packed arrangement are formed to have maximum widths of from about 100 Å to about 2000 Å.

26. The method of claim 19 wherein substantially all of the openings are formed to be in a hexagonally closest-packed arrangement.

27. The method of claim 19 comprising:
providing a substrate which includes an aluminum-containing material supported by a semiconductor base; and
anodizing the aluminum-containing material to convert the material to the body; said body consisting of aluminum oxide and having the openings extending entirely therethrough.

28. The method of claim 27 further comprising forming integrated circuitry within the base, and wherein at least some of the integrated circuitry is at least some of the circuitry formed to control current flow through the electrically conductive liners.

29. The method of claim 27 wherein the substrate includes at least some regions of conductive material under the aluminum-containing material, and wherein the anodizing extends the openings to the conductive material.

30. The method of claim 27 wherein the anodizing extends the openings only partially through the aluminum oxide to leave a remainder of aluminum oxide between openings and the underlying substrate, and further comprising utilizing an etch to extend the openings entirely through the aluminum oxide.

\* \* \* \* \*